(12) United States Patent
Yu et al.

(10) Patent No.: US 10,867,885 B2
(45) Date of Patent: Dec. 15, 2020

(54) HEAT SPREADING DEVICE AND METHOD

(71) Applicant: Taiwan Semiconductor Manufacturing Company, Ltd., Hsinchu (TW)

(72) Inventors: Chen-Hua Yu, Hsinchu (TW); Wensen Hung, Zhubei (TW); Ming-Fa Chen, Taichung (TW); Tsung-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/572,127

(22) Filed: Sep. 16, 2019

(65) Prior Publication Data

US 2020/0013698 A1 Jan. 9, 2020

Related U.S. Application Data

(62) Division of application No. 15/800,349, filed on Nov. 1, 2017, now Pat. No. 10,483,187.

(60) Provisional application No. 62/527,770, filed on Jun. 30, 2017.

(51) Int. Cl.
| | |
|---|---|
| *H01L 23/373* | (2006.01) |
| *H01L 25/00* | (2006.01) |
| *H01L 25/18* | (2006.01) |
| *H01L 23/367* | (2006.01) |
| *H01L 21/48* | (2006.01) |
| *H01L 23/42* | (2006.01) |

(52) U.S. Cl.
CPC ...... *H01L 23/3738* (2013.01); *H01L 21/4871* (2013.01); *H01L 23/367* (2013.01); *H01L 25/18* (2013.01); *H01L 25/50* (2013.01); *H01L 23/3736* (2013.01); *H01L 23/42* (2013.01); *H01L 2224/06155* (2013.01); *H01L 2224/06519* (2013.01); *H01L 2224/17155* (2013.01); *H01L 2224/17519* (2013.01); *H01L 2924/15311* (2013.01); *H01L 2924/16152* (2013.01)

(58) Field of Classification Search
CPC .......... H01L 25/0657; H01L 25/50; H01L 2924/181; H01L 24/73; H01L 23/3121; H01L 23/3738

See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |

(Continued)

*Primary Examiner* — Zandra V Smith
*Assistant Examiner* — John M Parker
(74) *Attorney, Agent, or Firm* — Slater Matsil, LLP

(57) ABSTRACT

In an embodiment, a device includes: an integrated circuit die having a first side and a second side opposite the first side; a die stack on the first side of the integrated circuit die; a dummy semiconductor feature on the first side of the integrated circuit die, the dummy semiconductor feature laterally surrounding the die stack, the dummy semiconductor feature electrically isolated from the die stack and the integrated circuit die; a first adhesive disposed between the die stack and the dummy semiconductor feature; and a plurality of conductive connectors on the second side of the integrated circuit die.

20 Claims, 40 Drawing Sheets

(56) References Cited

U.S. PATENT DOCUMENTS

| | | |
|---|---|---|
| 9,299,649 B2 | 3/2016 | Chiu et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 2007/0296073 A1 | 12/2007 | Wu et al. |
| 2010/0102428 A1 | 4/2010 | Lee et al. |
| 2011/0188209 A1 | 8/2011 | Colgan et al. |
| 2011/0193221 A1* | 8/2011 | Hu .................... H01L 23/49816 257/737 |
| 2011/0215470 A1 | 9/2011 | Chen et al. |

* cited by examiner

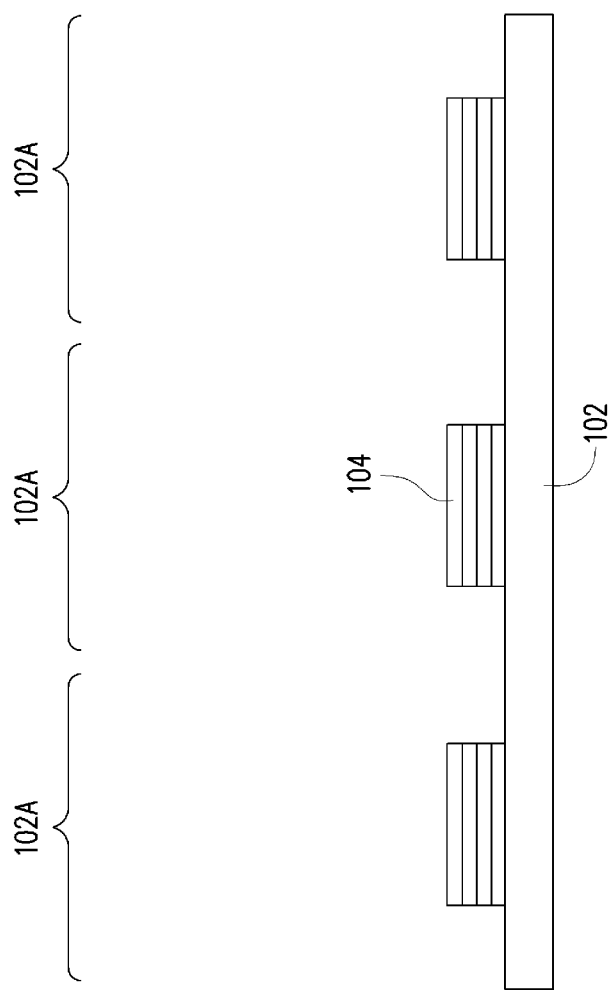

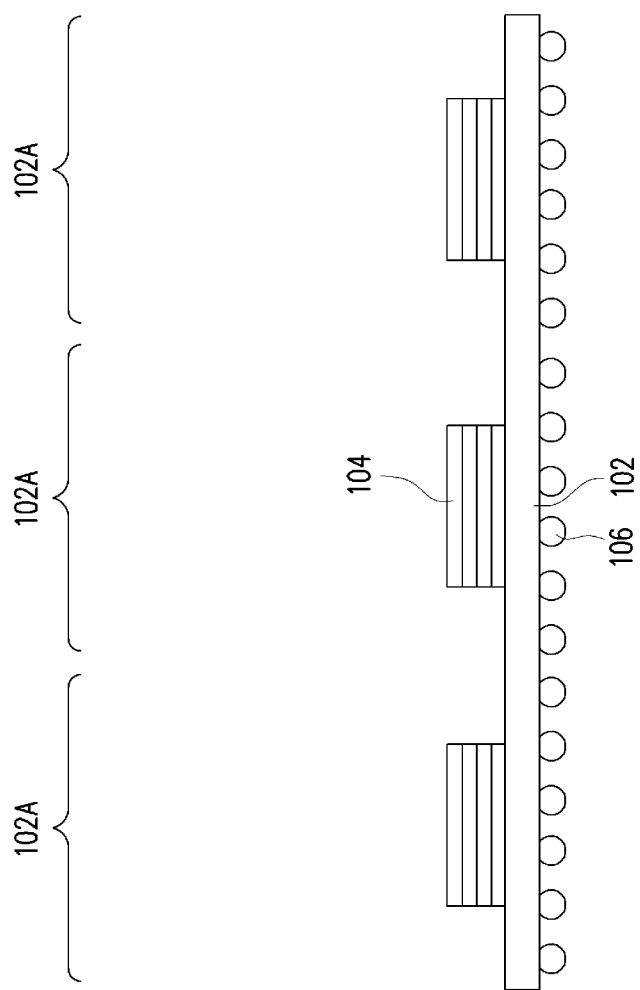

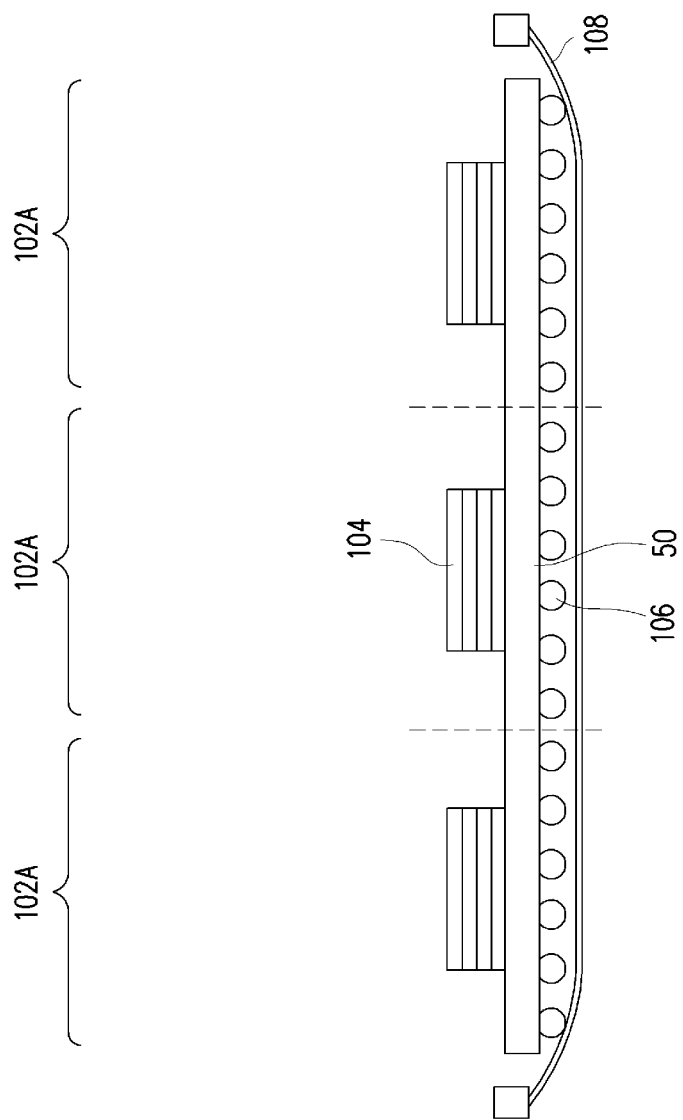

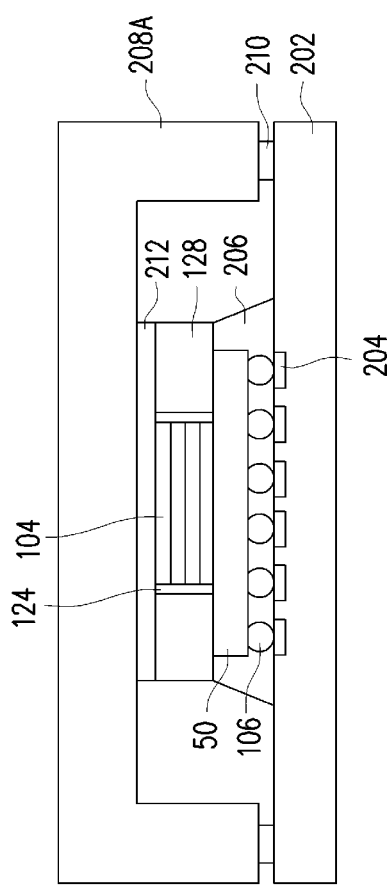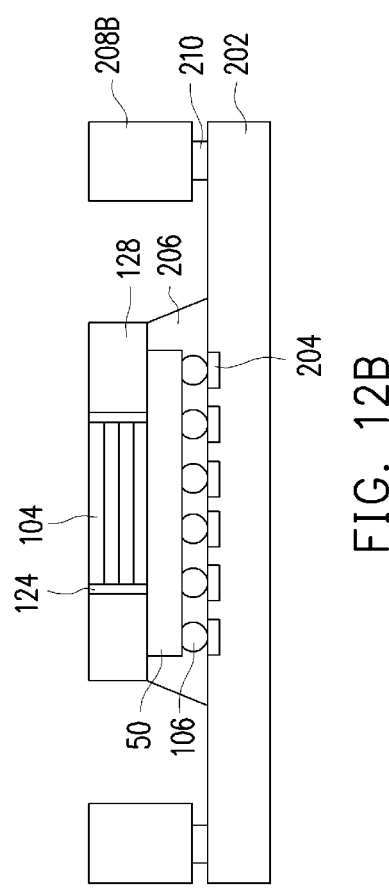
FIG. 12A
FIG. 12B

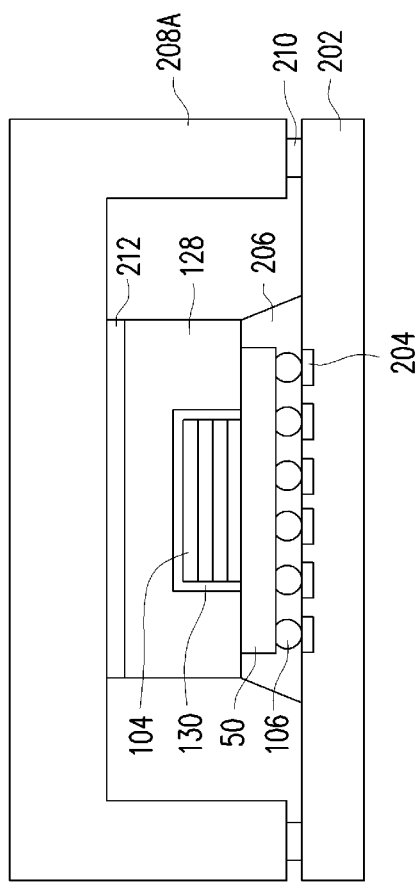
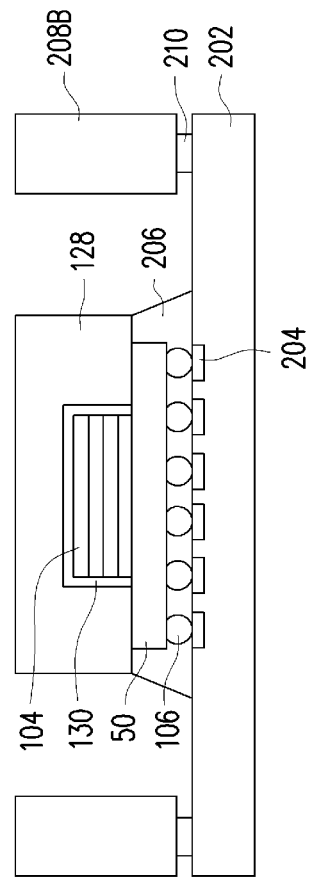
FIG. 17A
FIG. 17B

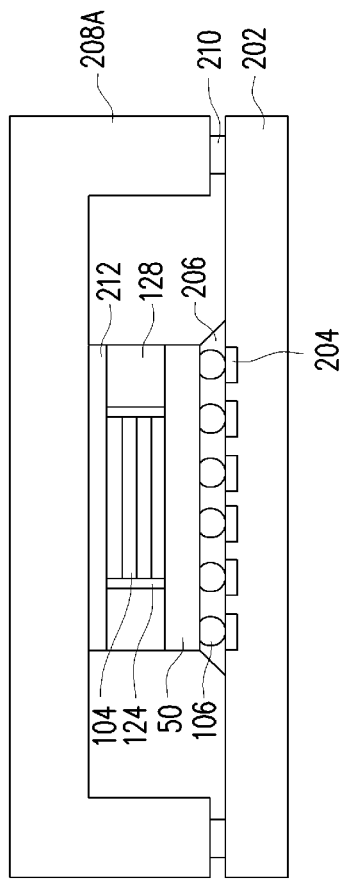
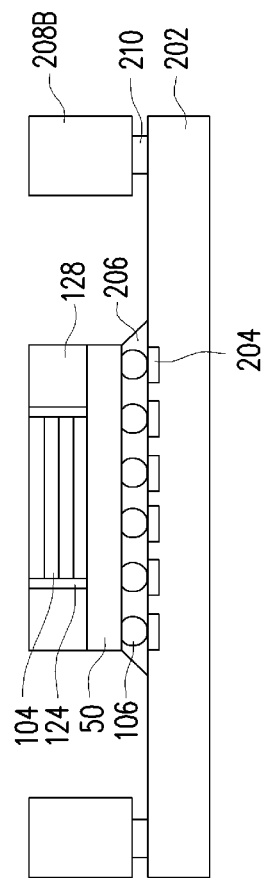
FIG. 24A
FIG. 24B

HEAT SPREADING DEVICE AND METHOD

PRIORITY CLAIM AND CROSS-REFERENCE

This application is a division of U.S. patent application Ser. No. 15/800,349, filed on Nov. 1, 2017, which claims the benefits of U.S. Provisional Application Ser. No. 62/527,770, filed on Jun. 30, 2017, which applications are hereby incorporated herein by reference.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Heat dissipation is a challenge in the 3DICs.

A bottleneck may exist in efficiently dissipating the heat generated in the inner dies of the 3DICs. In a typical 3DIC, the heat generated in inner dies may have to be dissipated to outer components before the heat can be conducted to a heat spreader. Between the stacked dies and outer components, however, there exist other materials such as underfill, molding compound, and the like, which are not effective in conducting heat. As a result, the heat may be trapped in an inner region of a bottom stacked die and cause a sharp local temperature peak (sometimes referred to as a hot spot). Furthermore, hot spots due to heat generated by high-power consuming dies may cause thermal crosstalk problems for surrounding dies, negatively affecting the surrounding dies' performance and the reliability of the whole 3DIC package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 12B are various views of intermediate steps during a process for forming device packages, in accordance with some embodiments.

FIGS. 13 through 17B are various views of intermediate steps during a process for forming device packages, in accordance with some other embodiments.

FIGS. 18 through 24B are various views of intermediate steps during a process for forming device packages, in accordance with some other embodiments.

DETAILED DESCRIPTION

Figure 1A:
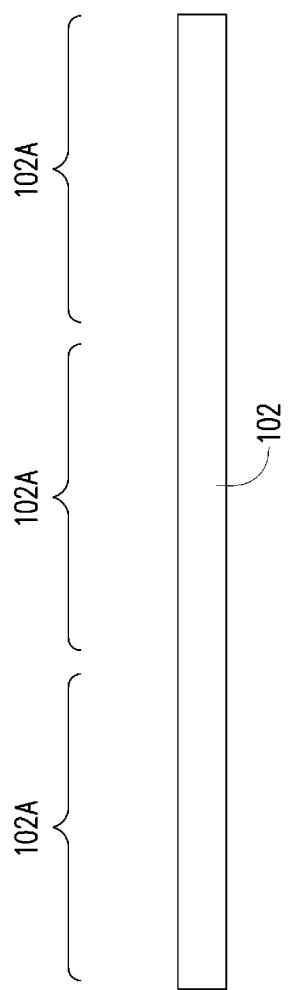
FIGS. 1A and 1B illustrate a cross-sectional view of a device wafer and an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a device package is formed having a die stack on an integrated circuit die, and dummy semiconductor features on the integrated circuit die surrounding the die stack. The dummy semiconductor features are electrically isolated from the integrated circuit die and die stack. The dummy semiconductor features are formed of a material with a high thermal conductivity, and help avoid heat buildup at the interface of the integrated circuit die and the die stack (e.g., in the bottom dies of the die stack). Avoiding heat buildup may improve the reliability and electrical performance of the device package.

Figure 1B:
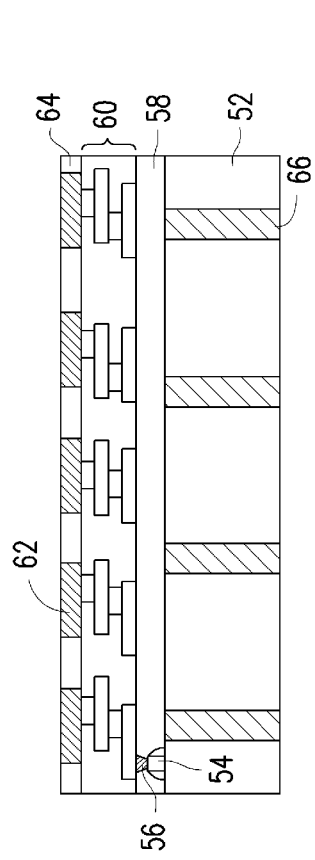

FIGS. 1A and 1B, respectively, illustrate a cross-sectional view of a device wafer 102 and an integrated circuit die 50 formed therein. In particular, the integrated circuit dies 50 may be interposers, logic devices, or the like formed in the device wafer 102, which may include different device regions 102A that are singulated in subsequent steps to form the integrated circuit dies 50. The integrated circuit dies 50 includes a substrate 52, devices 54, conductive plugs 56, an inter-layer dielectric (ILD) 58, an interconnect 60, die connectors 62, a dielectric material 64, and through vias 66. In some embodiments, the integrated circuit die 50 is a logic device or the like. In some embodiments, the integrated circuit die 50 is an interposer or the like.

The substrate 52 has a front surface (e.g., the surface facing upwards in FIGS. 1A and 1B), sometimes called an active side, and a back surface (e.g., the surface facing downwards in FIGS. 1A and 1B), sometimes called an inactive side. The substrate 52 is a singulated portion of the device wafer 102 (e.g., from one of the device regions 102A, discussed further below). The substrate 52 may be a semiconductor, such as silicon, doped or undoped, or an active layer of a semiconductor-on-insulator (SOI) substrate. The substrate 52 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The devices 54 may be formed in and/or on the front side of the substrate 52. The devices 54 may be transistors, diodes, capacitors, resistors, etc. In embodiments where the integrated circuit dies 50 are logic dies, the devices 54 include active devices. In embodiments where the integrated circuit dies 50 are interposers, the devices 54 may be passive devices or may be omitted, such that the integrated circuit dies 50 are free of active devices. The conductive plugs 56 are electrically and physically coupled to the devices 54. The ILD 58 surrounds the devices 54 and the conductive plugs 56.

The interconnect 60 interconnects the devices 54 to form an integrated circuit. The interconnect 60 may be formed by, for example, metallization patterns in dielectric layers on the front side of the substrate 52. The metallization patterns include metal lines and vias formed in one or more dielectric layers. The metallization patterns of the interconnect 60 are electrically coupled to the devices 54 by the conductive plugs 56.

The die connectors 62 may be conductive pillars (for example, comprising a metal such as copper, aluminum, tungsten, nickel, or alloys thereof), and are mechanically and electrically coupled to the interconnect 60. The die connectors 62 may be formed by, for example, plating, or the like. The die connectors 62 electrically couple the respective integrated circuits of the integrated circuit die 50.

The dielectric material 64 is on the active side of the integrated circuit dies 50, such as on the interconnect 60. The dielectric material 64 laterally encapsulates the die connectors 62, and the dielectric material 64 is laterally coterminous with the integrated circuit die 50. The dielectric material 64 is a silicon containing dielectric layer, and may be formed of silicon oxide, SiON, SiN, or the like, and may be formed by a deposition process such as CVD, PECVD, PVD, ALD, or the like. The dielectric material 64 may be a topmost layer of the interconnect 60.

The through vias 66 are formed in the semiconductor substrate and may be, e.g., through silicon vias (TSVs). The through vias 66 may be formed by applying and developing a suitable photoresist, and then etching the substrate 52 to generate TSV openings. The TSV openings may be filled with, e.g., a liner (not shown), a barrier layer (also not shown), and a conductive material. In an embodiment the liner may be a dielectric material such as silicon nitride, silicon oxide, a dielectric polymer, combinations of these, or the like, and may be formed by a process such as chemical vapor deposition, oxidation, physical vapor deposition, atomic layer deposition, or the like. The barrier layer may comprise a conductive material such as titanium nitride, although other materials, such as tantalum nitride, titanium, another dielectric, or the like may alternatively be utilized. The barrier layer may be formed using a CVD process, such as PECVD. However, other alternative processes, such as sputtering, metal organic chemical vapor deposition (MOCVD), or atomic layer deposition (ALD), may alternatively be used. The barrier layer may be formed so as to contour to the underlying shape of the TSV openings. The conductive material may be copper, aluminum, tungsten, alloys, doped polysilicon, combinations thereof, or the like. The conductive material may be formed by depositing a seed layer and then electroplating copper onto the seed layer, filling and overfilling the TSV openings. Once the TSV openings have been filled, excess barrier layer and excess conductive material outside of the TSV openings may be removed through a grinding process such as CMP, although any suitable removal process may be used.

FIGS. 2 through 12B are various views of intermediate steps during a process for forming device packages, in accordance with some embodiments. FIGS. 2 through 12B are cross-sectional views. In FIGS. 2 through 11, a device package 100 is formed by bonding various components to the device wafer 102. In an embodiment, the device package 100 is a chip-on-wafer (CoW) package, although it should be appreciated that embodiments may be applied to other 3DIC packages. In FIGS. 12A and 12B, a device package 200 is formed by mounting the device package 100 to a substrate. In an embodiment, the device package 200 is a chip-on-wafer-on-substrate (CoWoS) package, although it should be appreciated that embodiments may be applied to other 3DIC packages. FIGS. 12A and 12B show different embodiments.

In FIG. 2, die stacks 104 are bonded to the front side of the device wafer 102 after the integrated circuit dies 50 are formed on the device wafer 102. The die stacks 104 are bonded in each device region 102A before the device wafer 102 is singulated. The die stacks 104 may be high bandwidth memory (HBM) modules or hybrid memory cube (HMC) modules comprising a plurality of stacked and interconnected memory dies. The memory dies may be dynamic random access memory (DRAM) dies, static random access memory (SRAM) dies, or the like. The levels of the die stacks 104 may be interconnected with conductive features (not shown) such as through silicon vias (TSVs), microbumps, or the like. The die stacks 104 may be bonded to the device wafer 102 by, e.g., hybrid bonding, fusion bonding, solder joints (e.g., microbumps), or the like.

In embodiments where integrated circuit devices such as logic devices are formed in the device wafer 102, heat may be trapped under the die stacks 104 during operation. Logic devices may account for a large portion of the power consumption of each device package 100; for example, the logic devices may account for up to 90% of the power consumption of each device package 100. Further, the die stacks 104 may have a high power density. In embodiments where the die stacks 104 are stacked SRAM dies, the die stacks 104 may have a power density of from 50 watts/cm$^2$ to 300 W/cm$^2$. The combination of the high power density of the die stacks 104 and the high power consumption of the device wafer 102 may inhibit heat dissipation from the device wafer 102 through the die stacks 104. This may cause heat to be trapped at the bottommost dies of the die stacks 104, as heat from the bottommost dies must travel the furthest distance (e.g., through the die stacks 104). As a result, heat may build in the device package 100, causing it to exceed nominal operating temperatures, thereby degrading the reliability and electrical performance of the device package 100.

In FIG. 3, conductive connectors 106 are formed on the back side of the device wafer 102. The back side of the device wafer 102 may be thinned before the conductive connectors 106 are formed. The thinning may be accomplished by a chemical-mechanical polish (CMP), a grinding process, or the like. The conductive connectors 106 are electrically connected to features of the device wafer 102 (e.g., logic devices, interposers, etc.), and may be BGA connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 106 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

In FIG. 4, the device wafer 102 (see, e.g., FIG. 3) is singulated into the integrated circuit dies 50 by a singulation process to form intermediate device packages 100. Each of the singulated integrated circuit dies 50 is bonded to a corresponding die stack 104. The singulation may be accomplished by placing the device wafer 102 on tape 108, and sawing along scribe line regions e.g., between adjacent device regions 102A of the device wafer 102. In some embodiments, the singulation process includes a sawing process, a laser process, or a combination thereof. The singulation process singulates each of the package regions from adjacent package regions.

Figure 5:
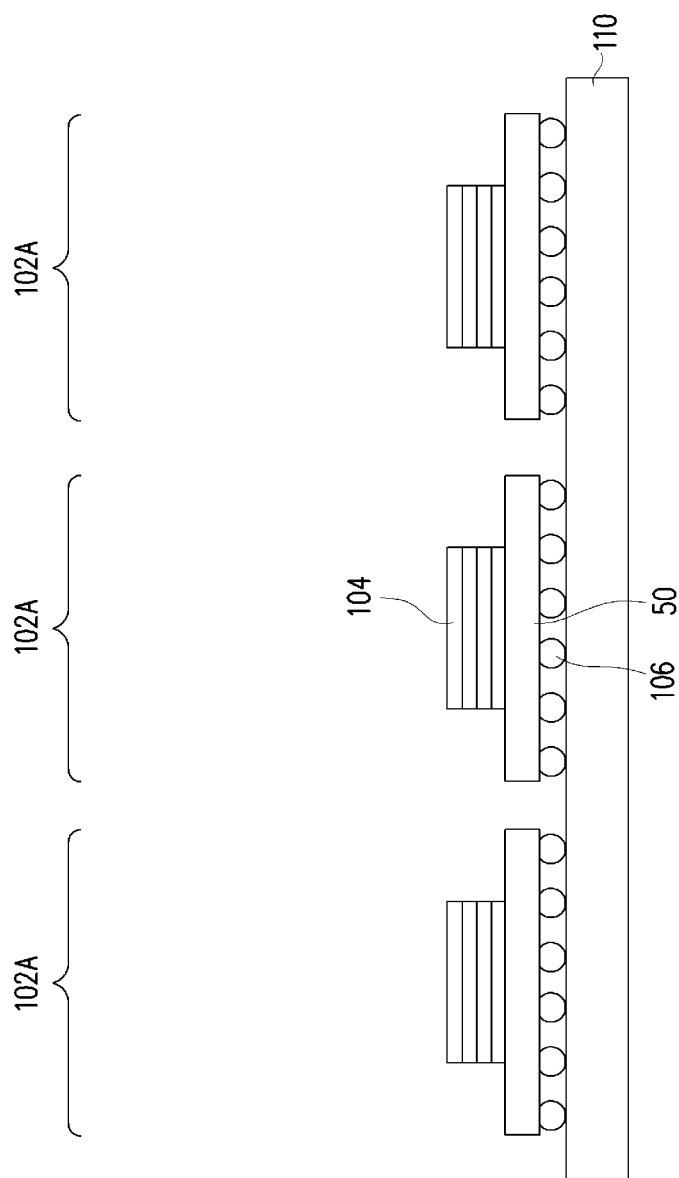

In FIG. 5, the intermediate device packages 100 including the integrated circuit dies 50 and die stacks 104 are placed on a carrier substrate 110. The carrier substrate 110 may be a glass carrier substrate, a ceramic carrier substrate, or the like. The carrier substrate 110 may also be a wafer or the like.

Figure 6:
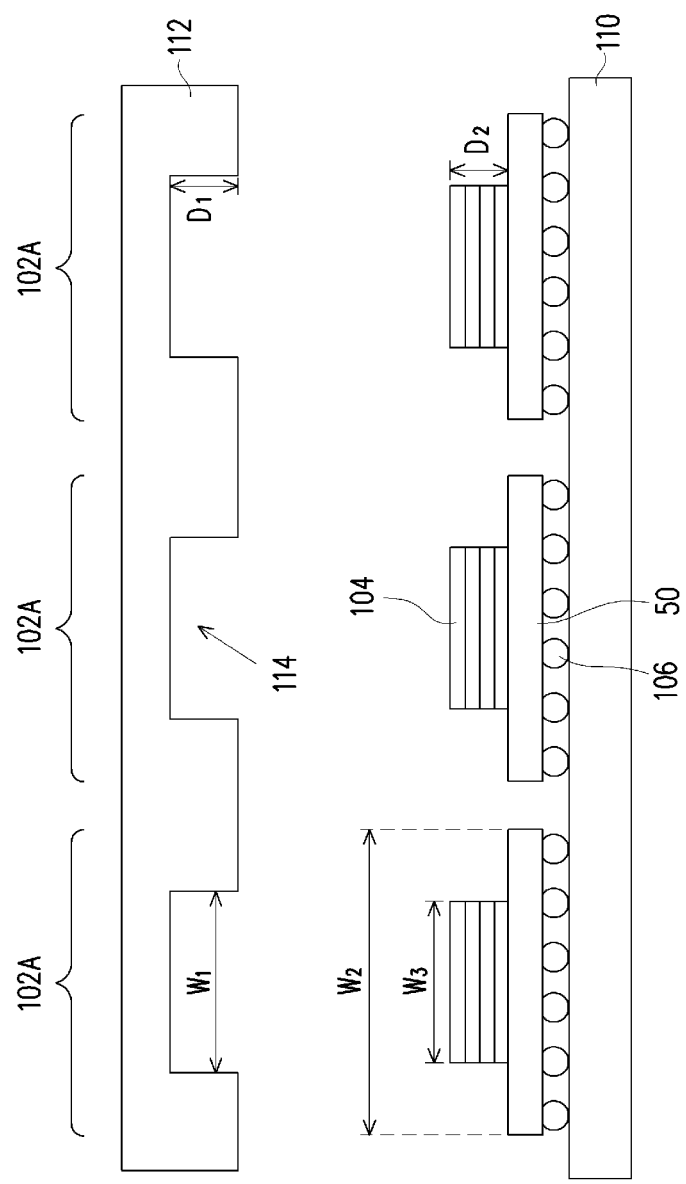

In FIG. 6, a dummy wafer 112 is prepared. The dummy wafer 112 is formed from a semiconductor material, and may be a semiconductor substrate. The semiconductor substrate a bulk semiconductor, a semiconductor-on-insulator (SOI) substrate, or the like, which may be doped (e.g., with a p-type or an n-type dopant) or undoped. Semiconductor materials are readily available in the fabrication process, and have a good thermal conductivity. For example, silicon has a thermal conductivity of from 120 to 150 W·m$^{-1}$·K$^{-1}$, making it a good conductor of heat. Recesses 114 are patterned in the front side of the dummy wafer 112. The pattern of the recesses 114 corresponds to the pattern of the intermediate device packages 100 on the carrier substrate 110. The recesses 114 have a width $W_1$ that is less than the total width $W_2$ of the integrated circuit dies 50 and greater than the width $W_3$ of the die stacks 104. The recesses 114 have a depth $D_1$ that is greater than the height $D_2$ of the die stacks 104. The recesses 114 may be patterned by an etching process, such as a suitable dry or wet etch. In an embodiment, a photoresist material is formed on the dummy wafer 112 and is exposed to light, thereby forming a pattern in the photoresist material corresponding to the pattern of the recesses 114. The patterned photoresist may then be used as an etching mask to etch the recesses 114 in the dummy wafer 112. In an embodiment, the dummy wafer 112 has no electrical function, and is free from active and passive devices.

Figure 7A:
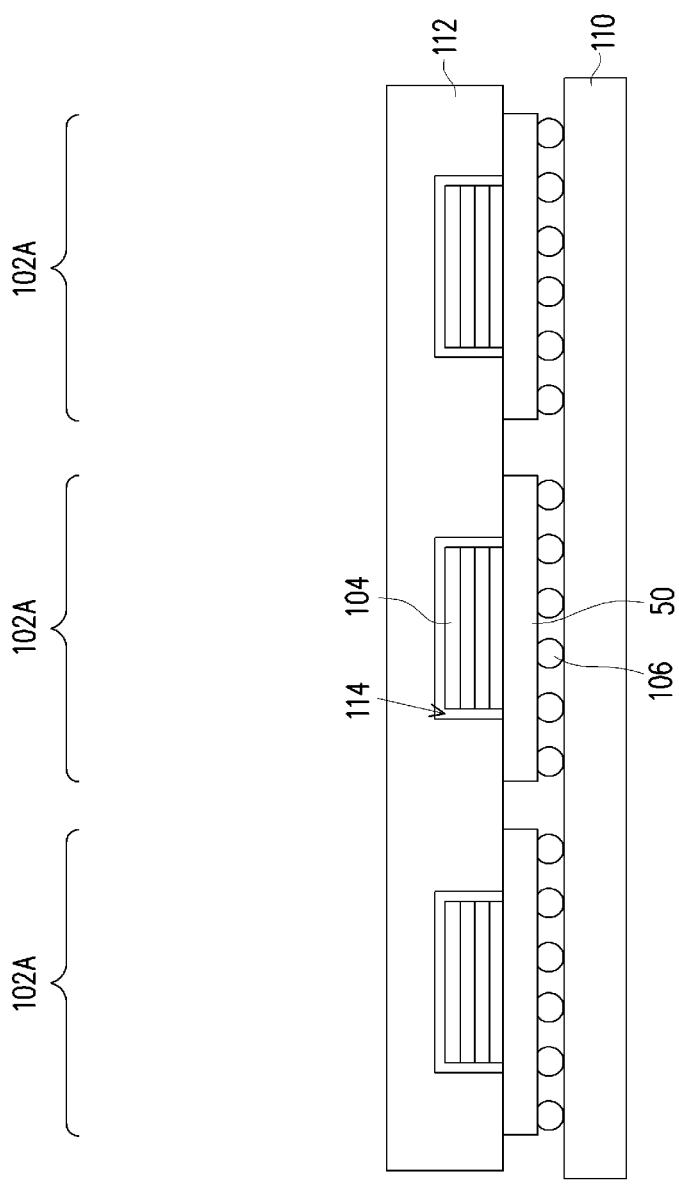
Figure 7B:
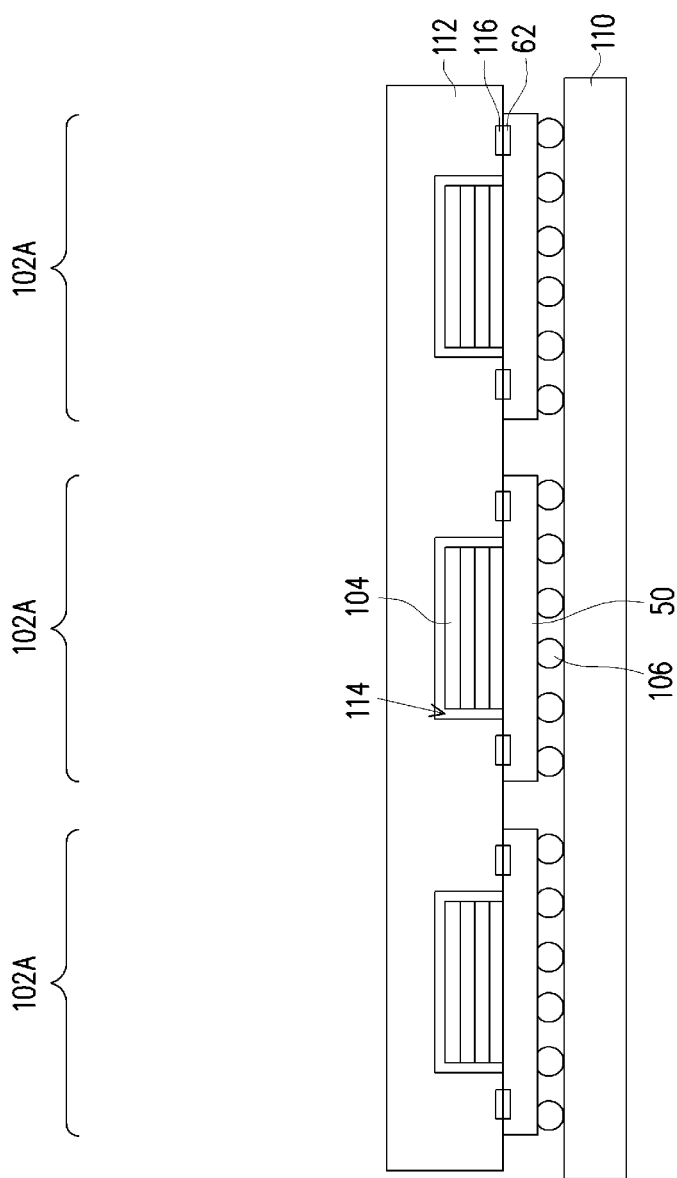
Figure 7C:
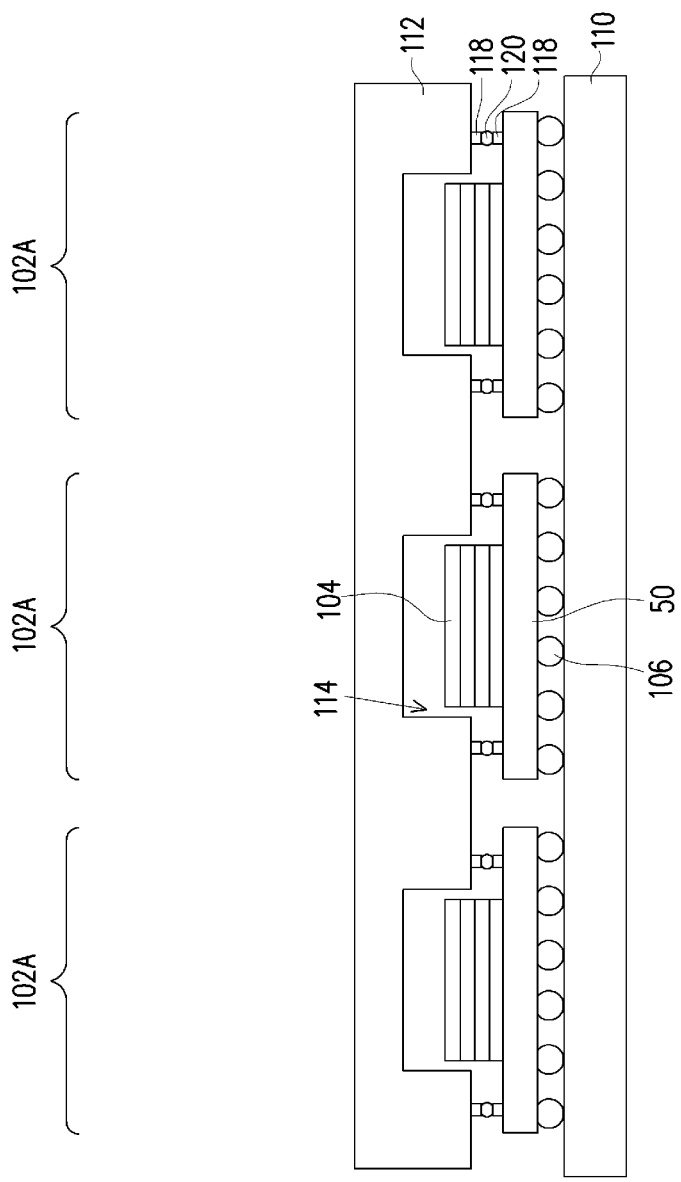

In FIGS. 7A through 7C, the front side of the dummy wafer 112 and placed on the intermediate device packages 100. FIGS. 7A through 7C show different embodiments, and subsequent processing steps are illustrated for the embodiment of FIG. 7A. Due to the relative widths of the die stacks 104, integrated circuit dies 50, and recesses 114, the die stacks 104 are disposed in the recesses 114, and the integrated circuit dies 50 contact the dummy wafer 112. The dummy wafer 112 is bonded to the integrated circuit die 50 of each intermediate device package 100. As noted above, the dummy wafer 112 may have no electrical function. Further, no electrical junctions (e.g., p-n junctions, metal-semiconductor junctions, or the like) are formed at the interfaces of the dummy wafer 112 and integrated circuit dies 50. Thus, the dummy wafer 112 may be electrically isolated from active devices of the die stack 104 and integrated circuit dies 50 (e.g., the devices 54), and other surrounding devices. The dummy wafer 112 may be bonded to the integrated circuit dies 50 by, e.g., fusion bonding, hybrid bonding, microbumps, or the like.

In embodiments where the dummy wafer 112 is bonded to the integrated circuit dies 50 by fusion bonding (e.g., FIG. 7A), an oxide layer such as the dielectric material 64 is used to form covalent bonds between the dummy wafer 112 and intermediate device packages 100. In such embodiments, portions of the dielectric material 64 that contact the dummy wafer 112 may be substantially free from the die connectors 62; e.g., the die connectors 62 may only be disposed under the die stacks 104. The interface between the dummy wafer 112 and intermediate device packages 100 may be silicon-to-silicon, silicon-to-oxide, oxide-to-oxide, or any other covalent bonding mechanism. A surface treatment may be performed on the integrated circuit dies 50 and/or dummy wafer 112, forming OH bonds in the top of the dielectric material 64 and/or dummy wafer 112. The dummy wafer 112 is then aligned over the intermediate device packages 100 and pressed against the integrated circuit dies 50 to form bonds with the dielectric material 64. After being pressed together, the intermediate device packages 100 and dummy wafer 112 may be annealed to strengthen the bonds. During the annealing, the OH bonds in the top of the dielectric material 64 and/or dummy wafer 112 break to form Si—O—Si bonds between the integrated circuit dies 50 (e.g., the interconnect 60) and dummy wafer 112, thereby strengthening the bond between the integrated circuit dies 50 and dummy wafer 112.

In embodiments where the dummy wafer 112 is bonded to the integrated circuit dies 50 by hybrid bonding (e.g., FIG. 7B), dummy bonding pads 116 are formed in the dummy wafer 112. In such embodiments, the die connectors 62 not disposed under the die stacks 104 may be dummy bonding pads that are electrically isolated from the devices 54 of the integrated circuit dies 50; e.g., only the die connectors 62 disposed under the die stacks 104 may be electrically connected to the devices 54. A surface treatment may be performed, as described above. The intermediate device packages 100 and dummy wafer 112 are aligned (including the dummy bonding pads 116 and die connectors 62), and are pressed against one another to form weak bonds. An annealing process may be performed, as described above, to strengthen the bonds between the dielectric and metal features of the integrated circuit dies 50 and dummy wafer 112.

In embodiments where the dummy wafer 112 is bonded to the integrated circuit dies 50 by microbumps (e.g., FIG. 7C), dummy microbumps 118 may be formed on the integrated circuit dies 50 and the front side of the dummy wafer 112. The dummy microbumps 118 may be electrically isolated from the devices 54 of the integrated circuit dies 50. The dummy microbumps 118 may be aligned when placing the dummy wafer 112 on the intermediate device packages 100. A reflowable material 120, such as solder, may then be used to bond the microbumps 118 of the dummy wafer 112 to the microbumps 118 of the integrated circuit dies 50.

Figure 8:
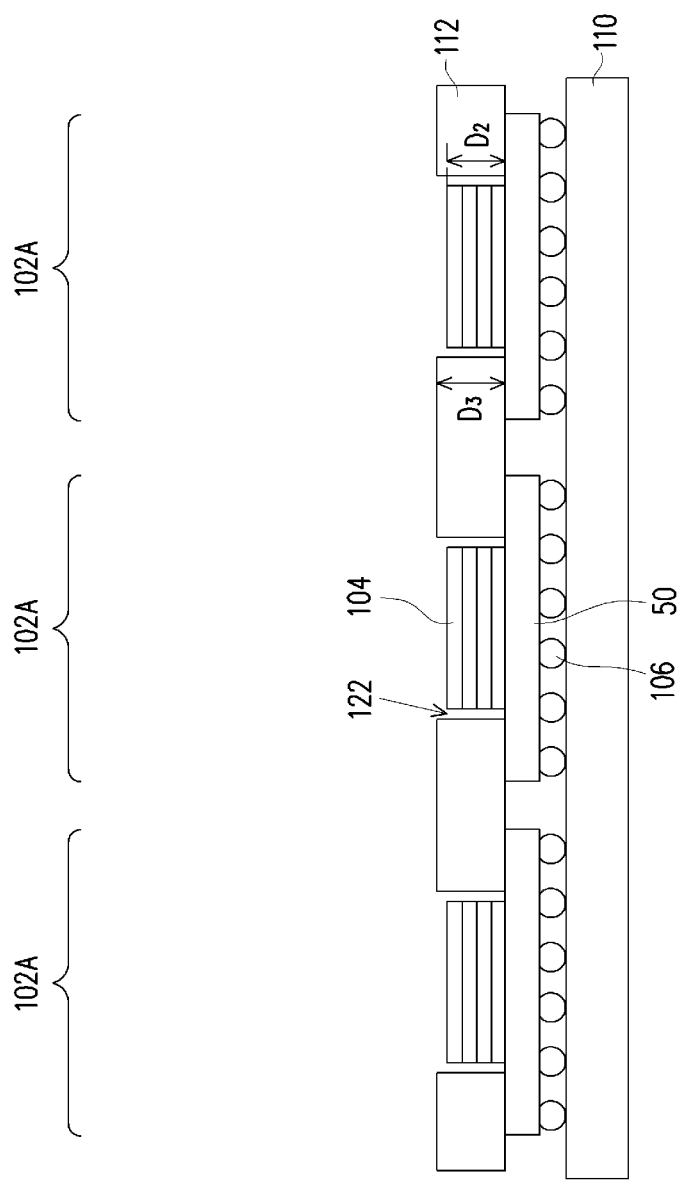

In FIG. 8, the dummy wafer 112 is thinned by a planarization process. The planarization process may be, for example, a CMP, a grinding process, or the like. The planarization process is performed on the back side of the dummy wafer 112 until the recesses 114 extend through the dummy wafer 112, thereby forming openings 122. The die stacks 104 are disposed in the openings 122. In the embodiment shown, the planarization process is stopped after the openings 122 are formed, and the depth $D_3$ of the openings 122 is greater than the height $D_2$ of the die stacks 104. In other embodiments, the back side of the dummy wafer 112 is level with the top surfaces of the die stacks 104 after the planarization process is performed.

Figure 9:
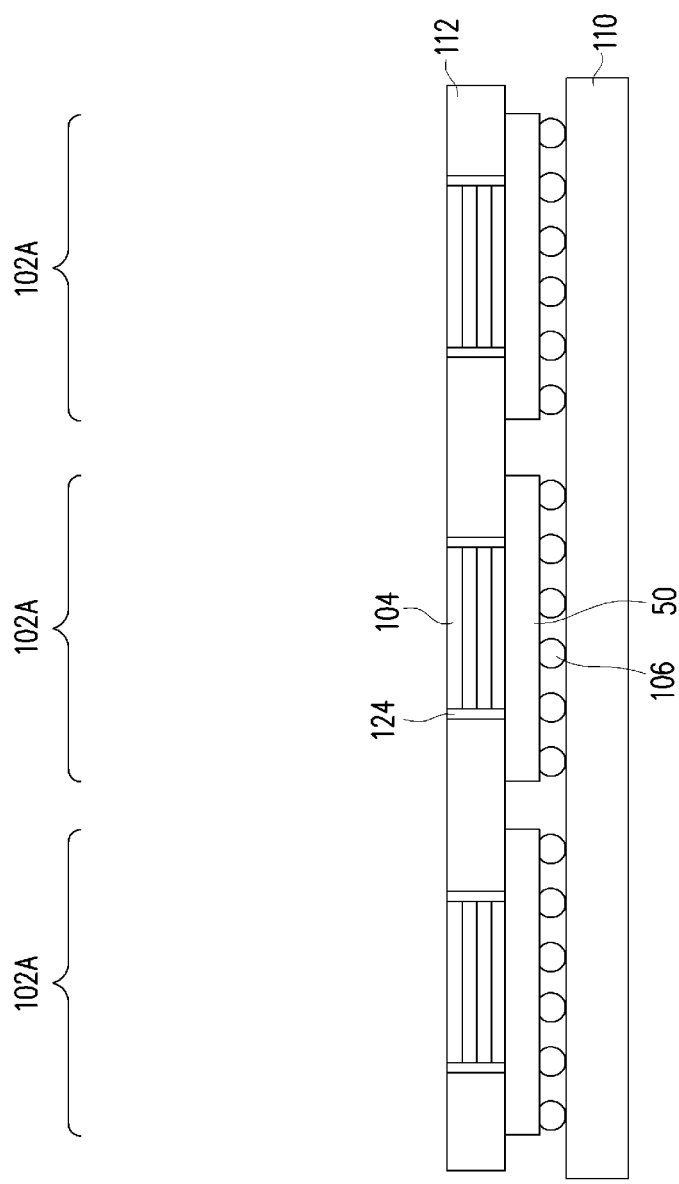

In FIG. 9, an adhesive 124 is formed in the openings 122. The adhesive 124 may be a molding compound, epoxy, or the like, and may be applied by compression molding, transfer molding, injection molding, or the like. The adhesive 124 is formed in the openings 122, and excess may be formed over the die stacks 104 and/or the dummy wafer 112. The adhesive 124 is then cured. An optional planarization process may be performed to remove excess adhesive 124 over the die stacks 104 and/or the dummy wafer 112. After planarization, top surfaces of the adhesive 124, die stacks 104, and dummy wafer 112 are level.

Figure 10:
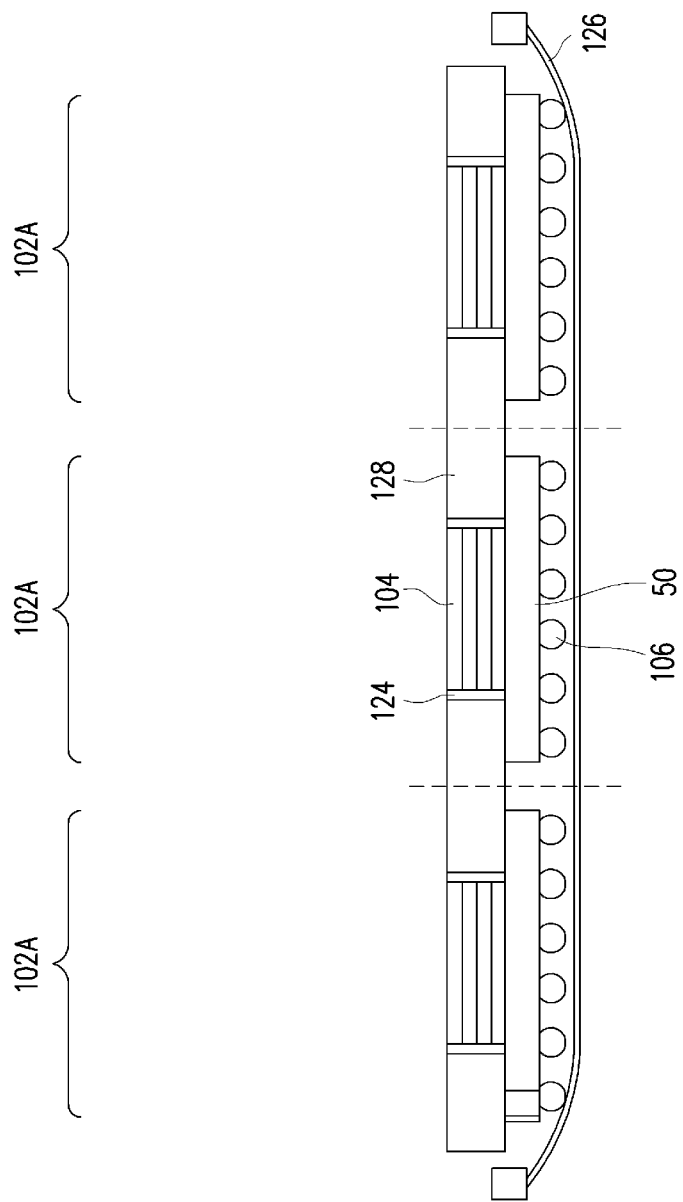

In FIG. 10, a carrier substrate de-bonding is performed to detach (de-bond) the carrier substrate 110 from the intermediate device packages 100. The dummy wafer 112 is then singulated by a singulation process, thereby forming dummy semiconductor features 128. The singulation may be accomplished by placing the dummy wafer 112 and device packages 100 on tape 126, and sawing along scribe line regions e.g., between adjacent ones of the device packages 100. In some embodiments, the singulation process includes a sawing process, a laser process, or a combination thereof. The singulated packages are the final device packages 100.

Figure 11:
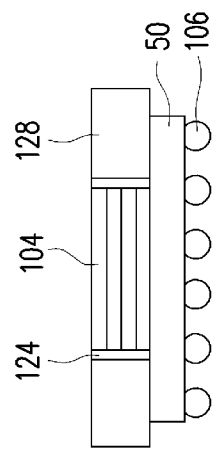

FIG. 11 shows the resulting singulated device package 100. In each device package 100, the dummy semiconductor features 128 surround the die stack 104 and contact the integrated circuit die 50. Edges of the dummy semiconductor features 128 extend laterally past the edges of the integrated circuit die 50. In other words, outer sidewalls of the dummy semiconductor features 128 have a width greater than a width of the integrated circuit die 50. The dummy semiconductor features 128 contact portions of the top surface of the integrated circuit die 50 not covered by the die stack 104 and adhesive 124. In an embodiment, the dummy semiconductor features 128 contact at least a majority (e.g., more than 50%) of the top surface area of the integrated circuit die 50.

As noted above, the integrated circuit dies 50 may be logic devices and may account for up to 90% of the power consumption of each device package 100. As such, the integrated circuit dies 50 may account for up to 90% of the heat produced by each device package 100. Further, the dummy semiconductor features 128 are formed of a semiconductor material, which is a good conductor of heat. Because the dummy semiconductor features 128 contact at least a majority of the top surface of the integrated circuit die 50, it may help remove some of the heat produced by the integrated circuit die 50. This may help prevent heat from being trapped under the die stacks 104, thereby decreasing the operating temperature of the device packages 100 and improving the reliability and electrical performance of the device packages 100.

In FIGS. 12A and 12B, the device package 200 is formed by mounting the device package 100 to a package substrate 202. The package substrate 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 202 may be a SOI substrate. Generally, an SOI substrate includes a layer of a semiconductor material such as epitaxial silicon, germanium, silicon germanium, SOI, SGOI, or combinations thereof. The package substrate 202 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 202.

The package substrate 202 may include active and passive devices (not shown). As one of ordinary skill in the art will recognize, a wide variety of devices such as transistors, capacitors, resistors, combinations of these, and the like may be used to generate the structural and functional requirements of the design for the device package 200. The devices may be formed using any suitable methods.

The package substrate 202 may also include metallization layers and vias (not shown) and bond pads 204 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 202 is substantially free of active and passive devices.

In some embodiments, the conductive connectors 106 are reflowed to attach the device package 200 to the bond pads 204, thereby bonding the integrated circuit die 50 to the package substrate 202. The conductive connectors 106 electrically and/or physically couple the package substrate 202, including metallization layers in the package substrate 202, to the device package 200. In some embodiments, passive devices (e.g., surface mount devices (SMDs), not illustrated) may be attached to the device package 200 (e.g., bonded to the bond pads 204) prior to mounting on the package substrate 202. In such embodiments, the passive devices may be bonded to a same surface of the device package 200 as the conductive connectors 106.

The conductive connectors 106 may have an epoxy flux (not shown) formed thereon before they are reflowed with at least some of the epoxy portion of the epoxy flux remaining after the device package 200 is attached to the package substrate 202. This remaining epoxy portion may act as an underfill to reduce stress and protect the joints resulting from the reflowing the conductive connectors 106.

An underfill 206 may be formed between the device package 100 and the package substrate 202, surrounding the conductive connectors 106 and the integrated circuit die 50. The underfill 206 may be formed by a capillary flow process after the device package 100 is attached or may be formed by a suitable deposition method before the device package 100 is attached.

In the embodiment shown in FIG. 12A, a heat spreader 208A is attached to the device package 200. The heat spreader 208A may be formed from a material with high thermal conductivity, such as steel, stainless steel, copper, the like, or combinations thereof. In some embodiments (discussed below), the heat spreader 208A is coated with another metal, such as gold. The heat spreader 208A covers and surrounds the device package 100. In some embodiments, the heat spreader 208A is a single contiguous material. In some embodiments, the heat spreader 208A includes multiple pieces that may be the same or different materials.

The heat spreader 208A is attached to the package substrate 202 by an adhesive 210. The adhesive 210 may be epoxy, glue, or the like, and may also be a thermally conductive material. The heat spreader 208A is also attached to the device package 100 by a thermal interface material (TIM) 212. The TIM 212 may be a polymeric material, solder paste, indium solder paste, or the like, and may be dispensed on the die stacks 104, adhesive 124, and dummy semiconductor features 128 before the heat spreader 208A is attached to the device package 200. The TIM 212 thermally couples the device package 100 and heat spreader 208A.

In the embodiment shown in FIG. 12B, a support ring 208B is attached to the device package 200. In some embodiments, the support ring 208B may be formed from a material with high thermal conductivity, such as steel, stainless steel, copper, the like, or combinations thereof. The support ring 208B provides mechanical reinforcement for the device package 200, and may prevent warpage of the device package 200. The support ring 208B is attached to the package substrate 202 by the adhesive 210.

FIGS. 13 through 17B are various views of intermediate steps during a process for forming device packages, in accordance with some other embodiments. FIGS. 13 through 17B are cross-sectional views.

Figure 13:
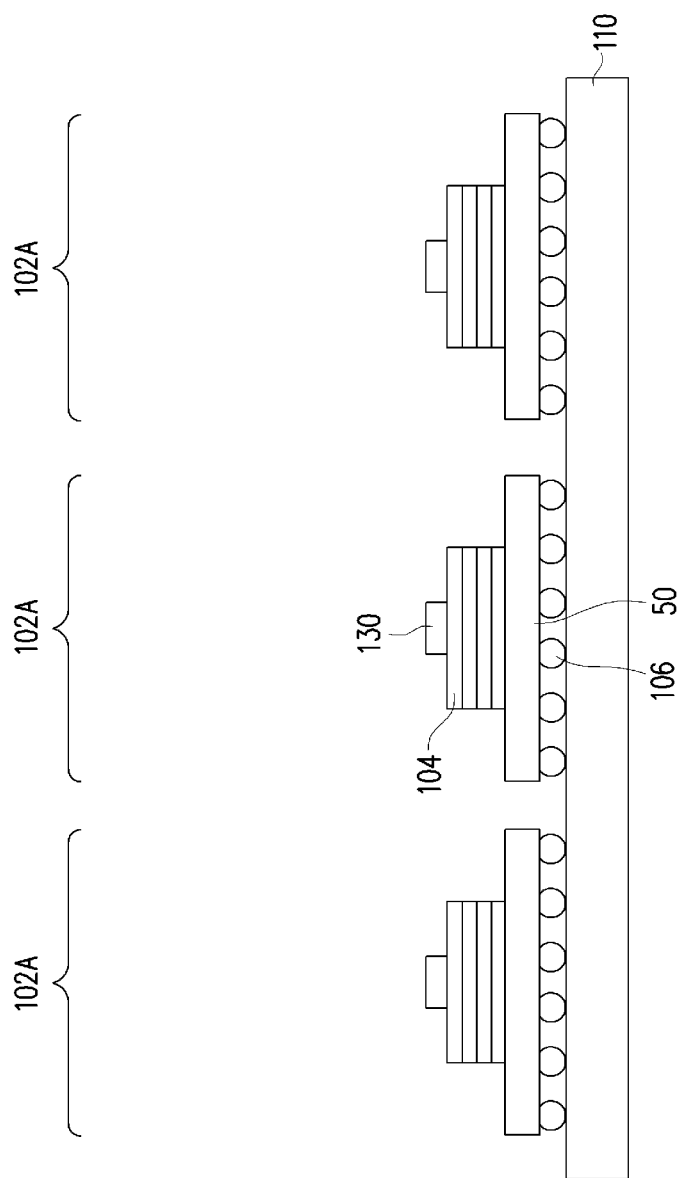

In FIG. 13, an adhesive 130 is formed on the die stacks 104 after the device packages 100 are placed on the carrier substrate 110. The adhesive 130 may be a TIM (similar to the TIM 212), a die attach film (DAF), the like, or combinations thereof.

Figure 14:
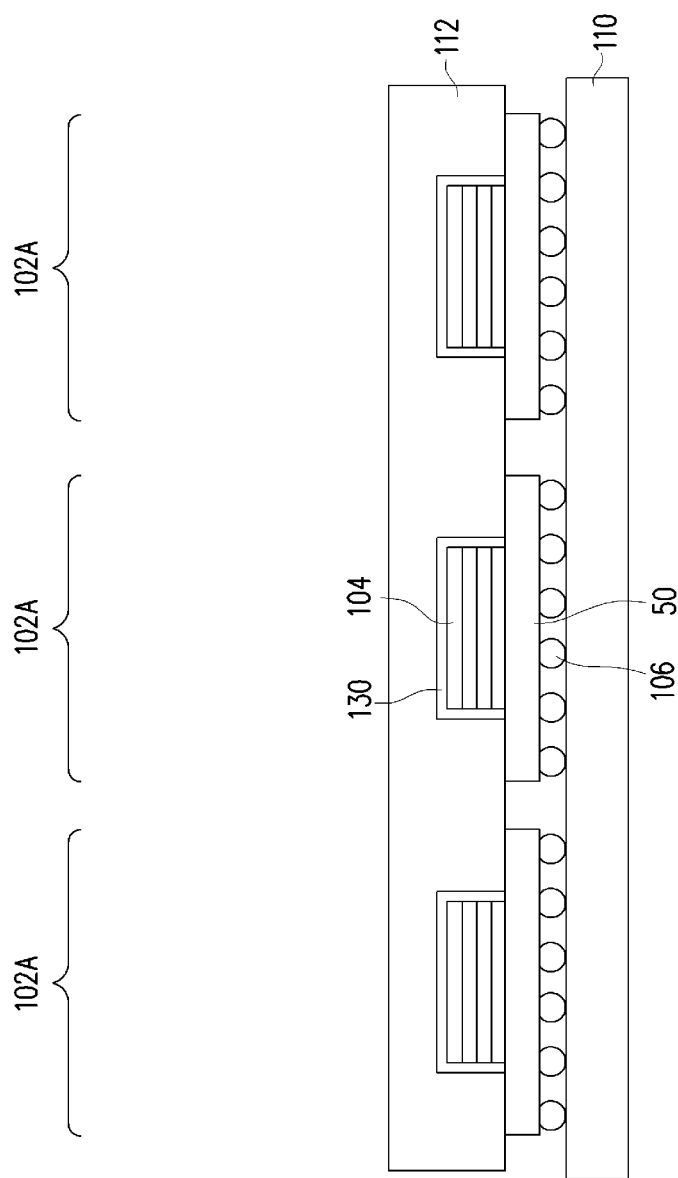

In FIG. 14, the dummy wafer 112 is placed on the device packages 100. The die stacks 104 and adhesive 130 are disposed in the recesses 114 after placement. Placing the dummy wafer 112 spreads the adhesive 130 such that it fills the recesses 114. In particular, the adhesive 130 fills voids between sides of the die stacks 104 and sides of the dummy wafer 112 defining the recesses 114. The dummy wafer 112 may be bonded to the device packages 100 in a similar manner as that discussed above for FIGS. 7A through 7C.

Figure 15:
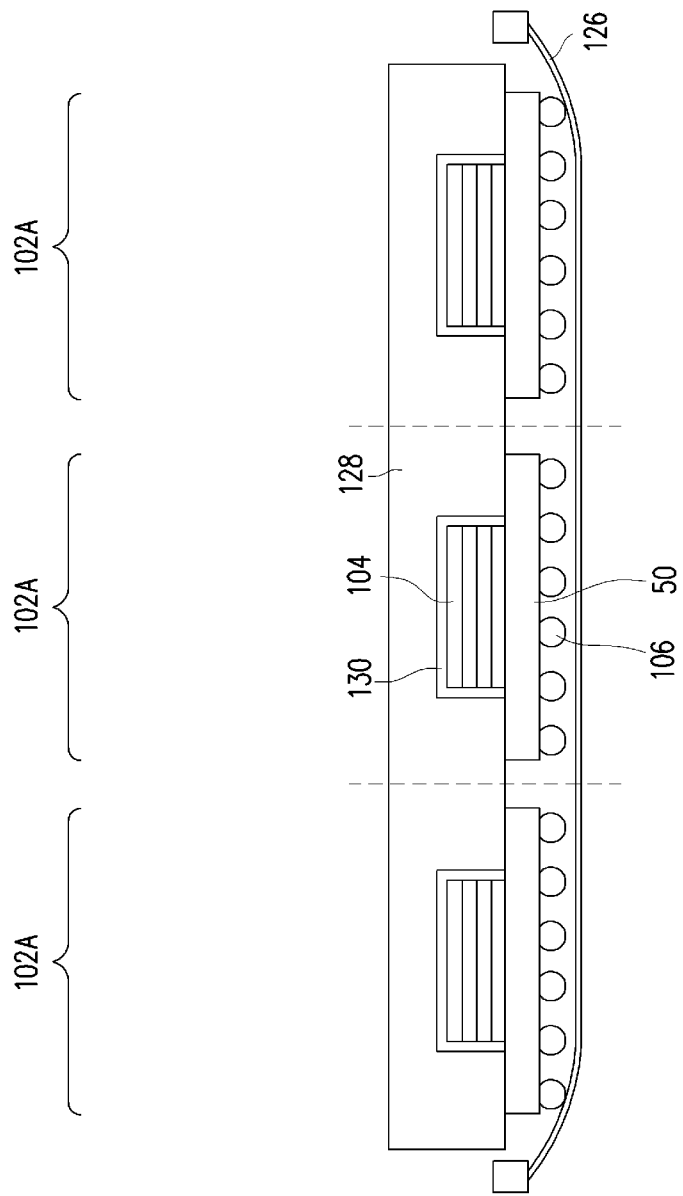

In FIG. 15, a carrier substrate de-bonding is performed to detach (de-bond) the carrier substrate 110 from the device packages 100. The dummy wafer 112 is then singulated by a singulation process, thereby forming the dummy semiconductor features 128 and the device packages 100. Because the adhesive 130 is formed in the recesses 114, the adhesive 124 is not formed, and various planarization steps may be omitted.

Figure 16:
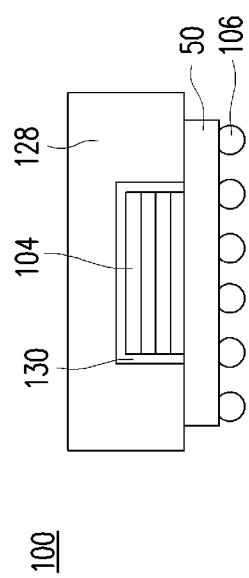

FIG. 16 shows the resulting singulated device package 100. Because the planarization steps may be omitted, the dummy semiconductor features 128 cover the die stacks 104. Further, edges of the dummy semiconductor features 128 extend laterally past the edges of the integrated circuit die 50.

In FIGS. 17A and 17B, the device package 200 is formed by mounting the device package 100 to the package substrate 202. In some embodiments, the conductive connectors 106 are reflowed to attach the device package 200 to the bond pads 204 of the package substrate 202. The underfill 206 may be formed between the device package 200 and the package substrate 202, surrounding the conductive connectors 106 and the integrated circuit die 50.

In the embodiment shown in FIG. 17A, the heat spreader 208A is attached to the device package 200. The adhesive 210 is used to adhere the heat spreader 208A to the package substrate 202. The TIM 212 may be dispensed on the dummy semiconductor features 128, thermally coupling the device package 100 and heat spreader 208A.

In the embodiment shown in FIG. 17B, the support ring 208B is attached to the device package 200. The adhesive 210 is used to adhere the support ring 208B to the package substrate 202. The support ring 208B provides mechanical reinforcement for the device package 200, and may prevent warpage of the device package 200.

FIGS. 18 through 24B are various views of intermediate steps during a process for forming device packages, in accordance with some other embodiments. FIGS. 18 through 24B are cross-sectional views.

Figure 18:
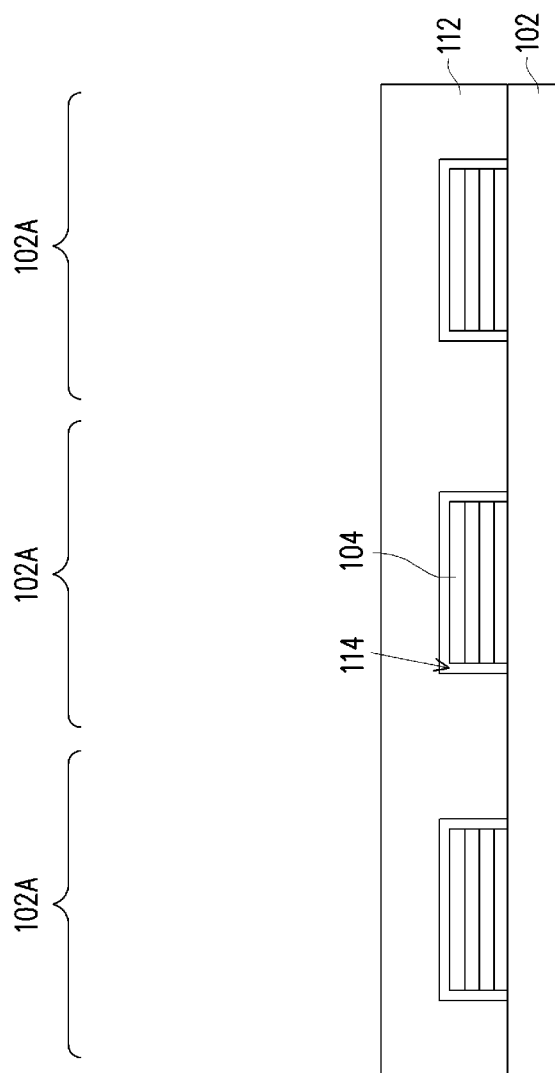

In FIG. 18, the dummy wafer 112 is placed on the device wafer 102 before the device wafer 102 is singulated into integrated circuit dies 50. The die stacks 104 are disposed in the recesses 114 of the dummy wafer 112. The front side of the dummy wafer 112 is bonded to the device wafer 102. The dummy wafer 112 may be bonded to the device wafer 102 in a similar manner as that discussed above for FIGS. 7A through 7C.

Figure 19:
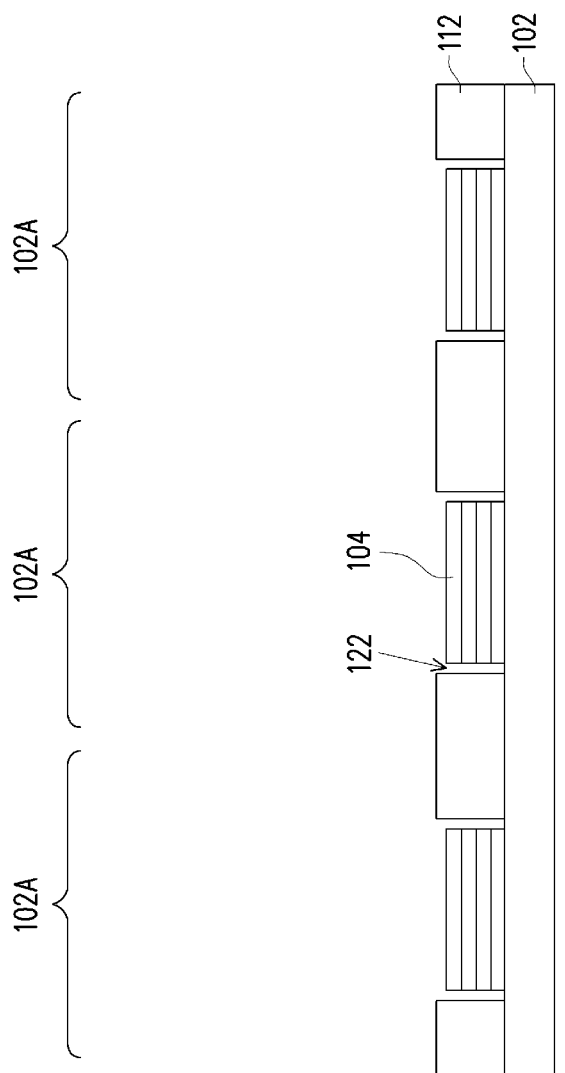

In FIG. 19, the dummy wafer 112 is thinned by a planarization process. The planarization process is performed on the back side of the dummy wafer 112 until the recesses 114 extend through the dummy wafer 112, thereby forming openings 122.

Figure 20:
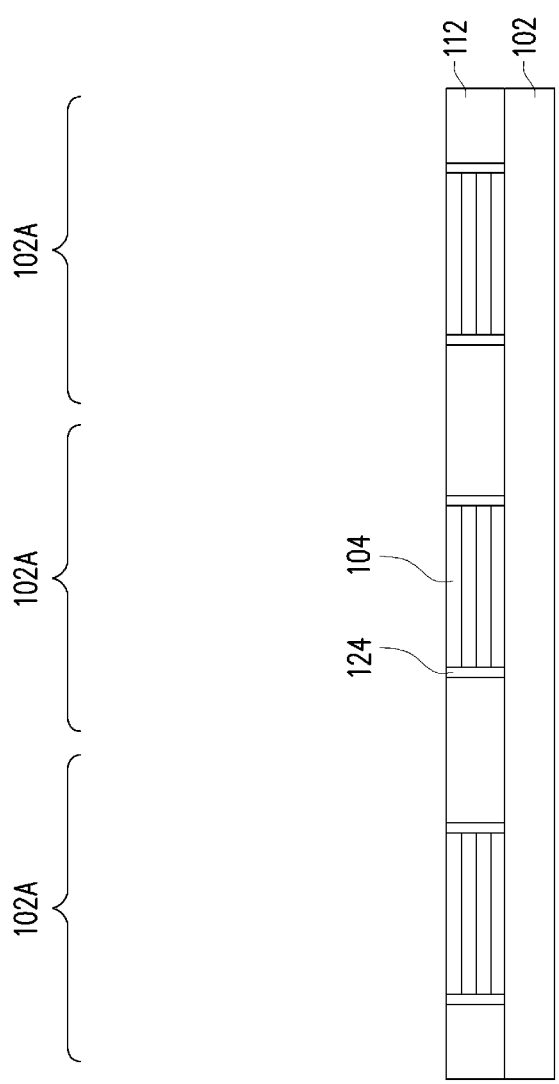

In FIG. 20, the adhesive 124 is formed in the openings 122. An optional planarization process may be performed to remove excess adhesive 124 over the die stacks 104 and/or the dummy wafer 112. After planarization, top surfaces of the adhesive 124, die stacks 104, and dummy wafer 112 are level.

Figure 21:
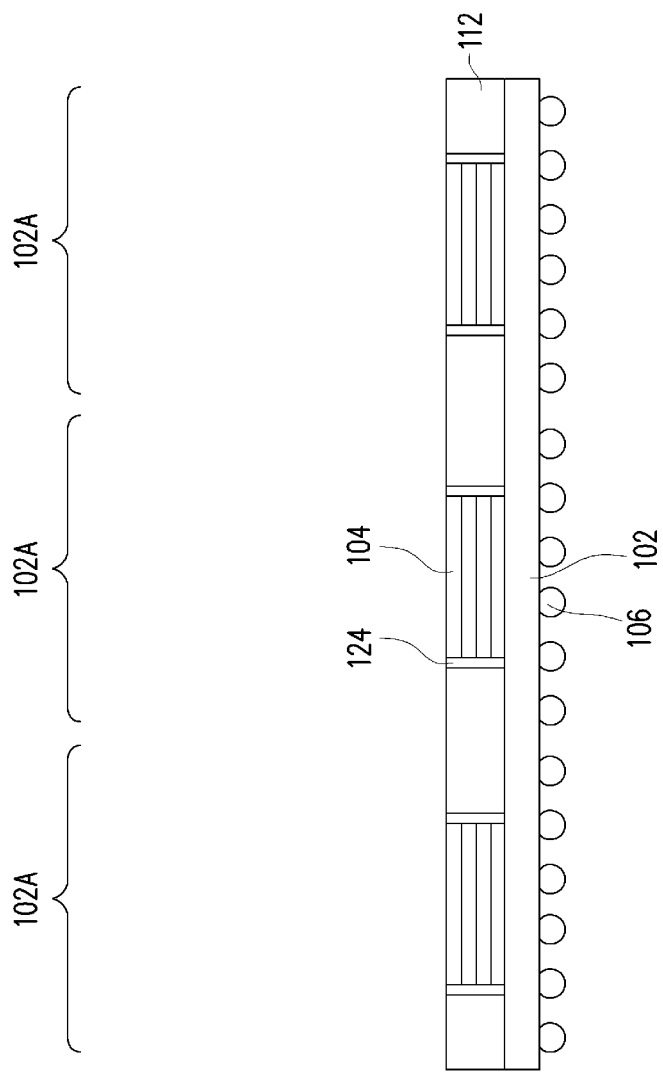

In FIG. 21, the conductive connectors 106 are formed on the back side of the device wafer 102. The conductive connectors 106 are electrically connected to features of the device wafer 102. The back side of the device wafer 102 may be thinned before the conductive connectors 106 are formed.

Figure 22:
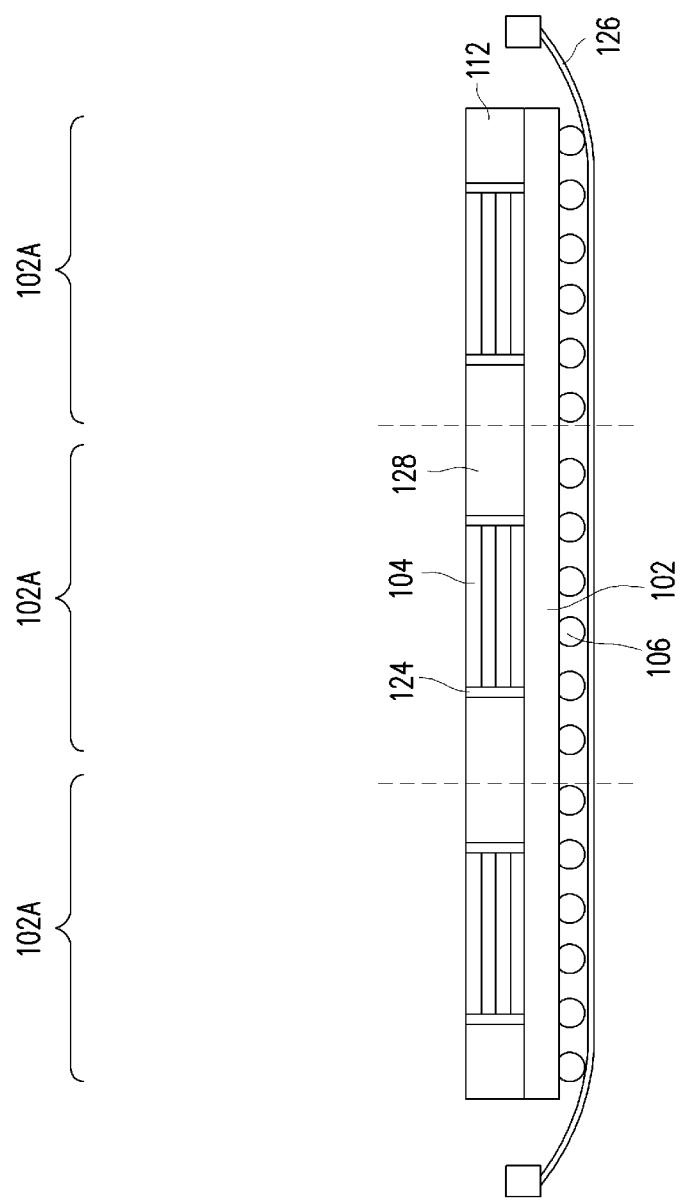

In FIG. 22, the device wafer 102 and dummy wafer 112 are simultaneously singulated by a singulation process, thereby forming the integrated circuit dies 50 and dummy semiconductor features 128. The singulation may be accomplished by placing the device wafer 102 on tape 126, and sawing along scribe line regions e.g., between adjacent package regions of the device wafer 102. In some embodiments, the singulation process includes a sawing process, a laser process, or a combination thereof.

Figure 23:
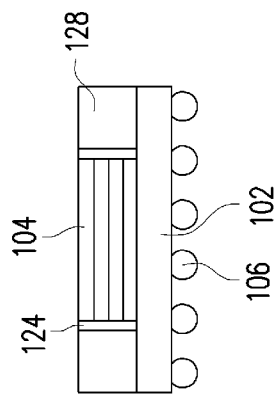

FIG. 23 shows the resulting singulated device package 100. Because the device wafer 102 and dummy semiconductor features 128 are simultaneously singulated, the edges of the dummy semiconductor features 128 are laterally coterminous with the edges of the integrated circuit die 50. In other words, the outer sidewalls of the dummy semiconductor features 128 have the same width as the outer sidewalls of the integrated circuit die 50.

In FIGS. 24A and 24B, the device package 200 is formed by mounting the device package 100 to the package substrate 202. In some embodiments, the conductive connectors 106 are reflowed to attach the device package 200 to the bond pads 204 of the package substrate 202. The underfill 206 may be formed between the device package 200 and the package substrate 202, surrounding the conductive connectors 106. Because the integrated circuit die 50 is the same width as the dummy semiconductor features 128, the underfill 206 does not surround the integrated circuit die 50.

In the embodiment shown in FIG. 24A, the heat spreader 208A is attached to the device package 200. The adhesive 210 is used to adhere the heat spreader 208A to the package substrate 202. The TIM 212 may be dispensed on the die stacks 104, adhesive 124, and dummy semiconductor features 128, thermally coupling the device package 100 and heat spreader 208A.

In the embodiment shown in FIG. 24B, the support ring 208B is attached to the device package 200. The adhesive 210 is used to adhere the support ring 208B to the package substrate 202. The support ring 208B provides mechanical reinforcement for the device package 200, and may prevent warpage of the device package 200.

FIGS. 25 through 32 are various views of intermediate steps during a process for forming device packages, in accordance with some other embodiments. FIGS. 25 through 32 are cross-sectional views. In the embodiment shown in FIGS. 25 through 32, vias 132 are formed in the dummy wafer 112. The material of the vias 132 has a higher thermal conductivity than the material of the dummy wafer 112, thereby further improving the thermal conductivity of the dummy wafer 112. Although the vias 132 are illustrated as being formed in the embodiment shown in FIGS. 18 through 24B, it should be appreciated that the vias 132 may be formed in the dummy wafer 112 for any embodiments where the heat spreader 208A is attached to the device package 200.

Figure 25:
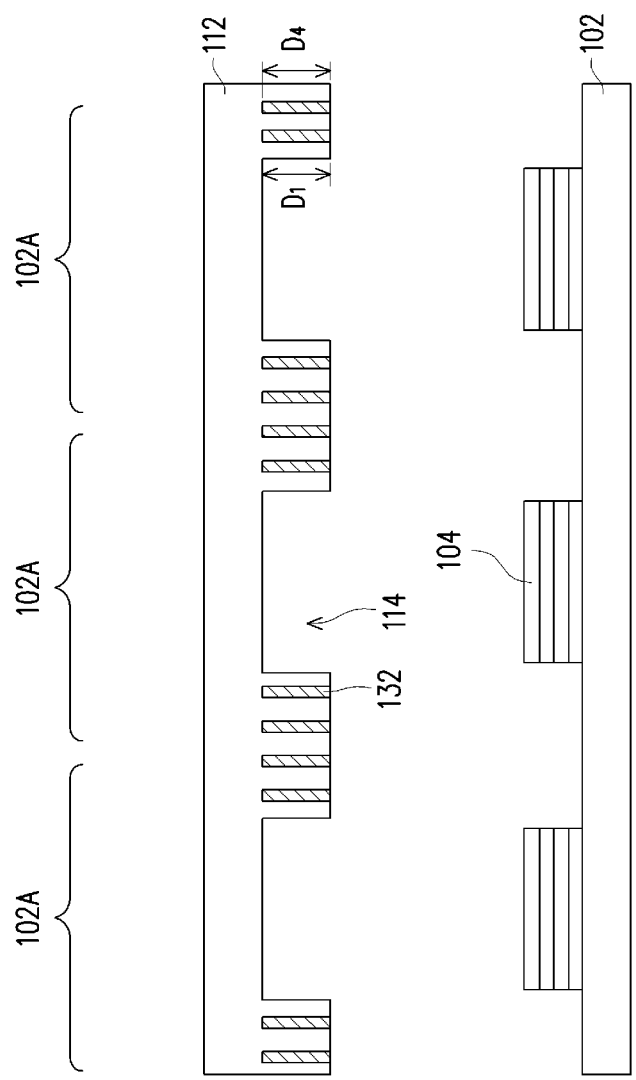
FIGS. 25 through 32 are various views of intermediate steps during a process for forming device packages, in accordance with some other embodiments.

In FIG. 25, the dummy wafer 112 is prepared. The vias 132 are formed in the dummy wafer 112. The vias 132 are through silicon vias (TSVs) that extend from the front side of the dummy wafer 112 at least partially into the dummy wafer 112 a depth $D_4$. The depth $D_4$ may be less than the depth $D_1$ of the recesses 114, or may be equal to or greater than the depth $D_1$.

The vias 132 may be formed by applying and developing a suitable photoresist to the front side of the dummy wafer 112, and then etching the dummy wafer 112 to generate TSV openings. The TSV openings may be filled with, e.g., a liner (not shown), a barrier layer (also not shown), and a conductive material. In an embodiment the liner may be a dielectric material such as silicon nitride, silicon oxide, a dielectric polymer, combinations of these, or the like, and may be formed by a process such as chemical vapor deposition, oxidation, physical vapor deposition, atomic layer deposition, or the like. The barrier layer may comprise a conductive material such as titanium nitride, although other materials, such as tantalum nitride, titanium, another dielectric, or the like may alternatively be utilized. The barrier layer may be formed using a CVD process, such as PECVD. However, other alternative processes, such as sputtering, metal organic chemical vapor deposition (MOCVD), or atomic layer deposition (ALD), may alternatively be used. The barrier layer may be formed so as to contour to the underlying shape of the TSV openings. The conductive material may be a metal having a higher thermal conductivity than the semiconductor material of the dummy wafer 112. In an embodiment, the conductive material comprises copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the TSV openings. Once the TSV openings have been filled, excess barrier layer and excess conductive material outside of the TSV openings (e.g., on the front side of the dummy wafer 112) may be removed through a grinding process such as CMP, although any suitable removal process may be used.

Figure 26:
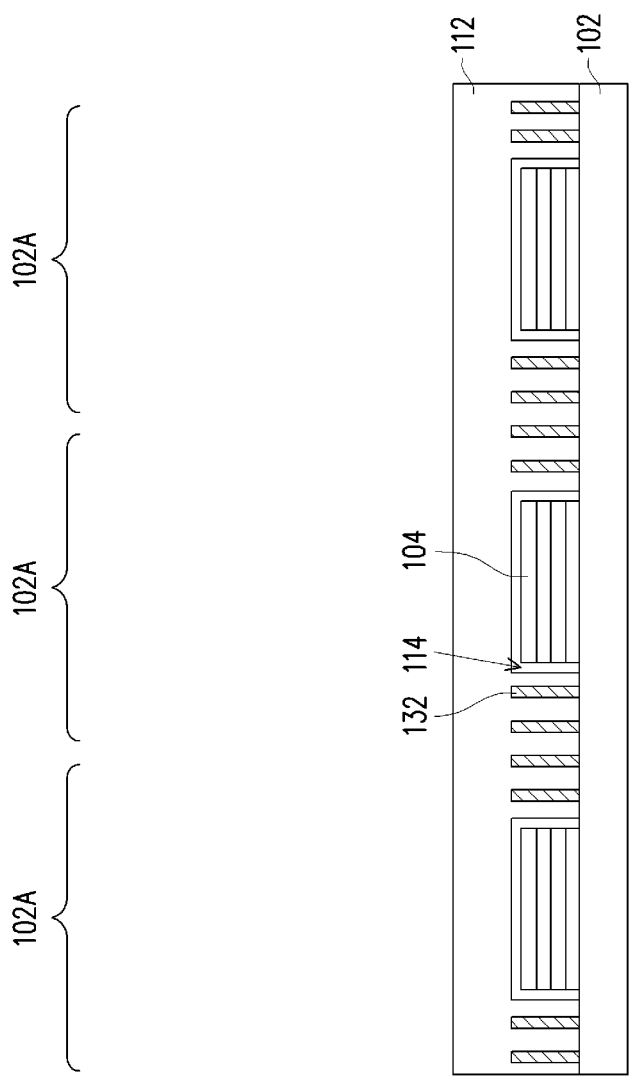

In FIG. 26, the dummy wafer 112 is flipped and placed on the device packages 100. The die stacks 104 are disposed in the recesses 114, and the integrated circuit dies 50 contact the dummy wafer 112. The dummy wafer 112 may be bonded to the device wafer 102 in a similar manner as that discussed above for FIGS. 7A through 7C. In embodiments where hybrid bonding is used, the vias 132 are coupled to metal features (e.g., the die connectors 62) of the integrated circuit dies 50. In such embodiments, the die connectors 62 not disposed under the die stacks 104 may be dummy bonding pads that are electrically isolated from the devices 54 of the integrated circuit dies 50; e.g., only the die connectors 62 disposed under the die stacks 104 may be coupled to the vias 132.

Figure 27:
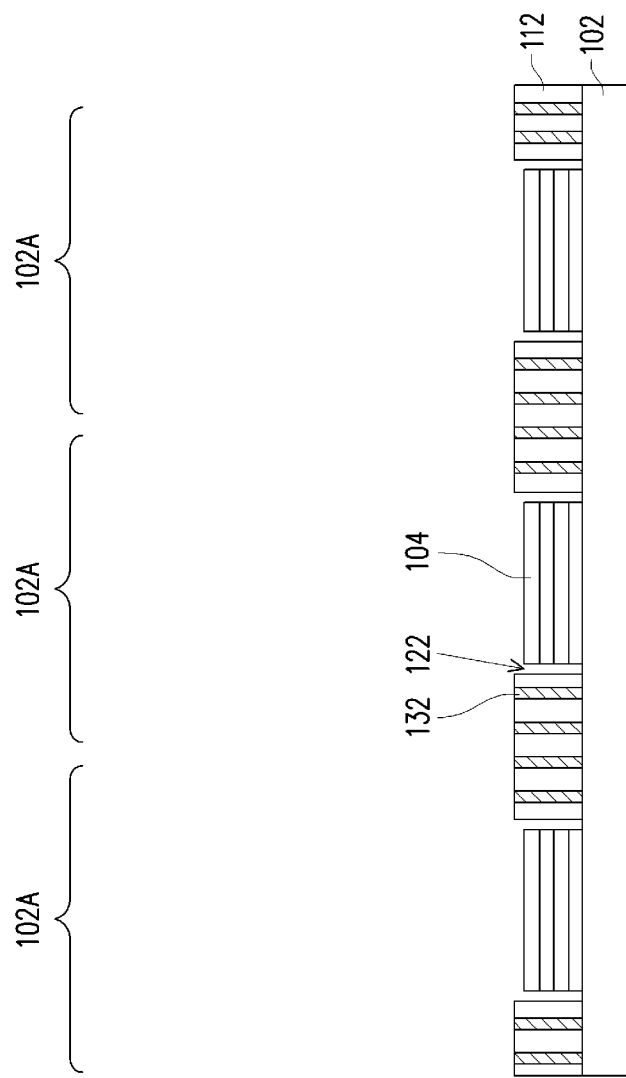

In FIG. 27, the dummy wafer 112 is thinned by a planarization process. The planarization process is performed on the back side of the dummy wafer 112 until the recesses 114 extend through the dummy wafer 112, thereby forming the openings 122.

Figure 28:
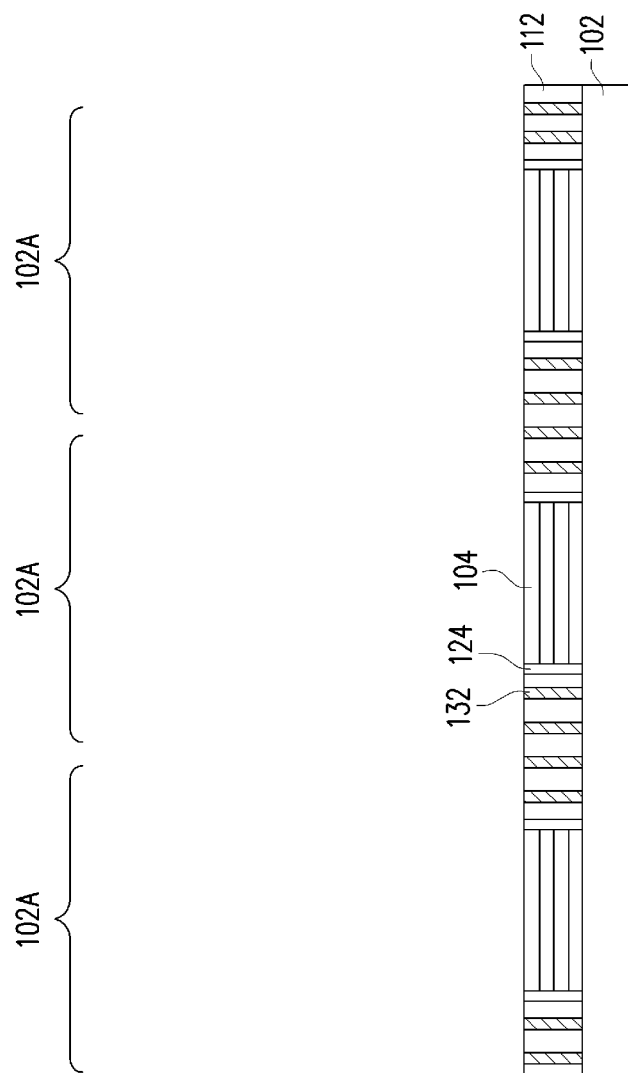

In FIG. 28, the adhesive 124 is formed in the openings 122. An optional planarization process may be performed to remove excess adhesive 124 over the die stacks 104 and/or the dummy wafer 112. After planarization, top surfaces of the adhesive 124, die stacks 104, and dummy wafer 112 are level.

Figure 29:
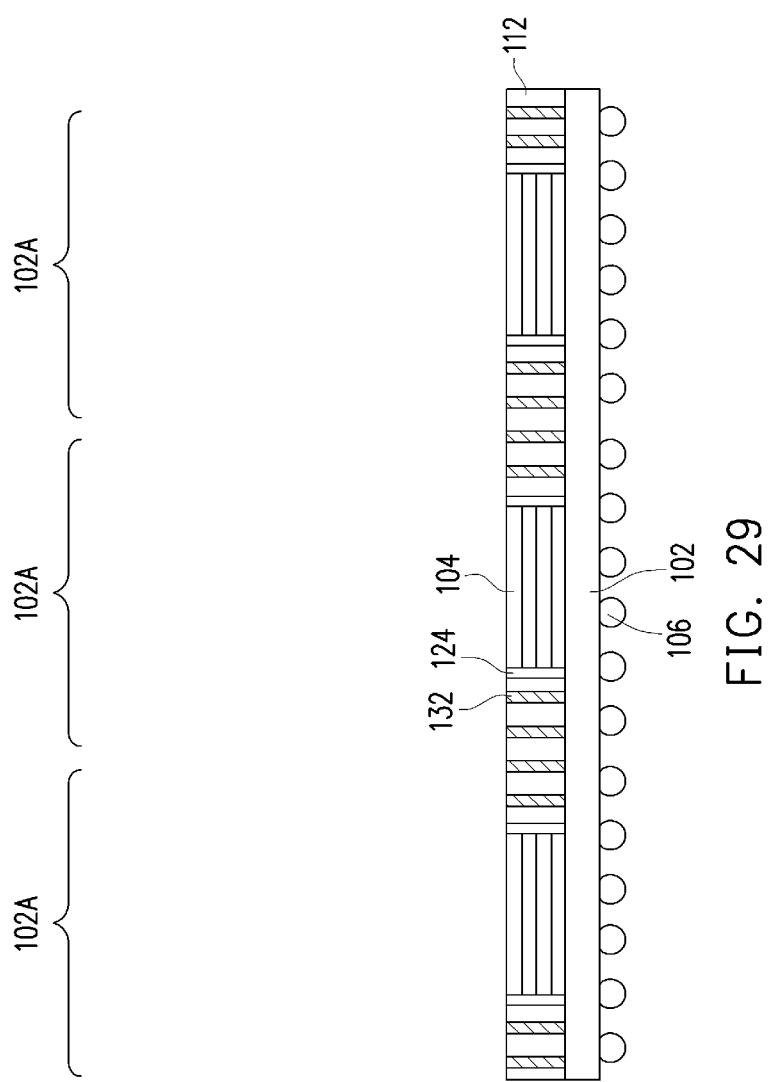

In FIG. 29, the conductive connectors 106 are formed on the back side of the device wafer 102. The conductive connectors 106 are electrically connected to features of the device wafer 102. The back side of the device wafer 102 may be thinned before the conductive connectors 106 are formed.

Figure 30:
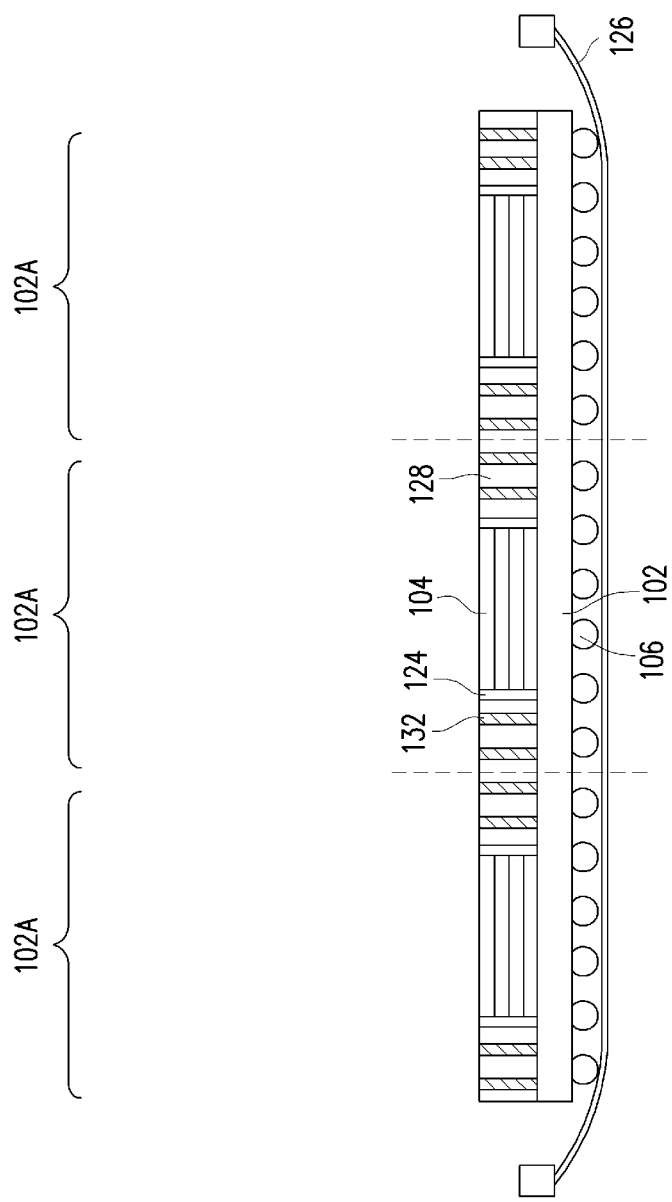

In FIG. 30, the device wafer 102 and dummy wafer 112 are simultaneously singulated by a singulation process, thereby forming the integrated circuit dies 50 and dummy semiconductor features 128. The singulation may be accomplished by placing the device wafer 102 on tape 126, and sawing along scribe line regions e.g., between adjacent package regions of the device wafer 102.

Figure 31:
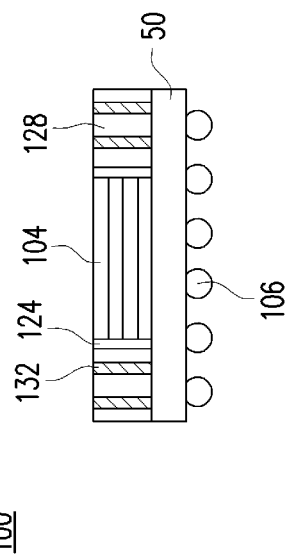

FIG. 31 shows the resulting singulated device package 100. Because the device wafer 102 and dummy semiconductor features 128 are simultaneously singulated, the edges of the dummy semiconductor features 128 are laterally coterminous with the edges of the integrated circuit die 50. In other words, the outer sidewalls of the dummy semiconductor features 128 have the same width as the outer sidewalls of the integrated circuit die 50. In the embodiment shown, the depth $D_4$ of the vias 132 is greater than or equal to the depth $D_1$ of the recesses 114, and the vias 132 extend from the front side to the back side of the dummy semiconductor features 128 in the resulting device package 100. A greater depth of the vias 132 may improve the thermal conductivity of the dummy semiconductor features 128.

Figure 32:
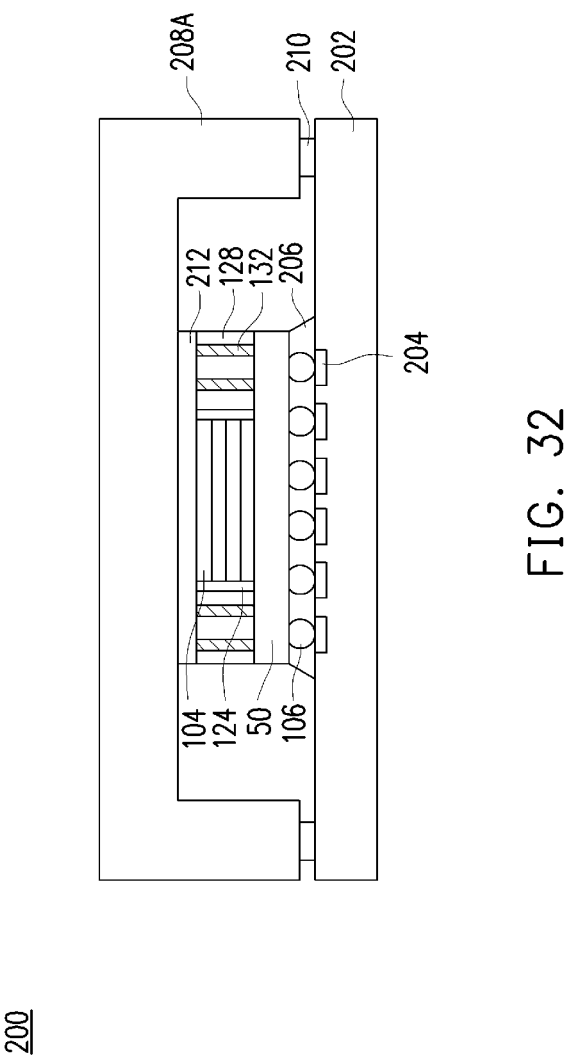

In FIG. 32, the device package 200 is formed by mounting the device package 100 to the package substrate 202. In some embodiments, the conductive connectors 106 are reflowed to attach the device package 200 to the bond pads 204 of the package substrate 202. The underfill 206 may be formed between the device package 200 and the package substrate 202, surrounding the conductive connectors 106. Because the integrated circuit die 50 is the same width as the dummy semiconductor features 128, the underfill 206 does not surround the integrated circuit die 50.

Further in FIG. 32, the heat spreader 208A is attached to the device package 200. The adhesive 210 is used to adhere the heat spreader 208A to the package substrate 202. The TIM 212 may be dispensed on the die stacks 104, adhesive 124, and dummy semiconductor features 128, thermally coupling the device package 100 and heat spreader 208A.

Figure 33:
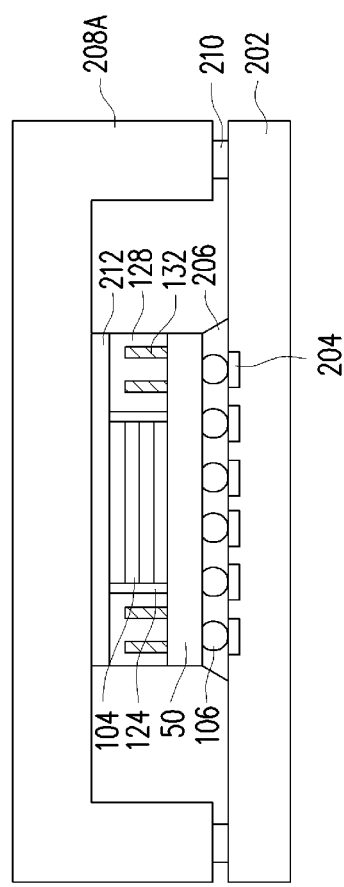
FIG. 33 shows an intermediate step during a process for forming device packages, in accordance with some other embodiments.

FIG. 33 shows an intermediate step during a process for forming device packages, in accordance with some other embodiments. FIG. 33 is a cross-sectional view. The embodiment shown in FIG. 33 is similar to the embodiment of FIG. 32, except the depth $D_4$ of the vias 132 is less than the depth $D_1$ of the recesses 114. As such, the vias 132 extend partially into the dummy semiconductor features 128. Forming the vias 132 to a shallower depth may decrease manufacturing costs.

FIGS. 34 through 37 are various views of intermediate steps during a process for forming device packages, in accordance with some other embodiments. FIGS. 34 through 37 are cross-sectional views. In the embodiment shown in FIGS. 34 through 37, dummy metallization 134 is formed on the device packages 100 before they are singulated. The dummy metallization 134 improves the thermal coupling between the device package 100 and heat spreader 208A. Although the dummy metallization 134 is illustrated as being formed in the embodiment shown in FIGS. 18 through 24B, it should be appreciated that the dummy metallization 134 may be formed for any embodiments where the heat spreader 208A is attached to the device package 200.

Figure 34:
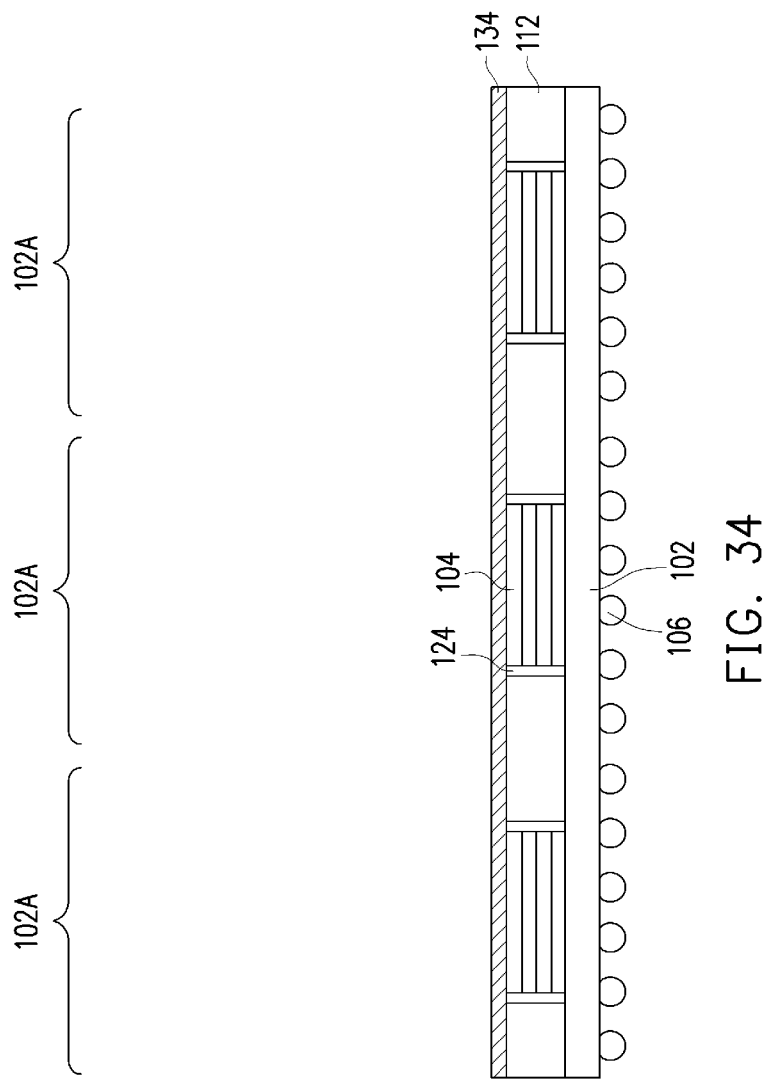
FIGS. 34 through 37 are various views of intermediate steps during a process for forming device packages, in accordance with some other embodiments.

In FIG. 34, the dummy metallization 134 is formed on the die stacks 104, dummy wafer 112, and adhesive 124. The dummy metallization 134 is formed after formation of the adhesive 124. The dummy metallization 134 may be formed from a conductive material or metal such as gold, indium, copper, or the like that has a higher thermal conductivity than the semiconductor material of the dummy wafer 112. The dummy metallization 134 may be formed by depositing a seed layer and then electroplating the conductive material onto the seed layer. The dummy metallization 134 may be electrically isolated from the die stacks 104, integrated circuit die 50, and other surrounding devices.

Figure 35:
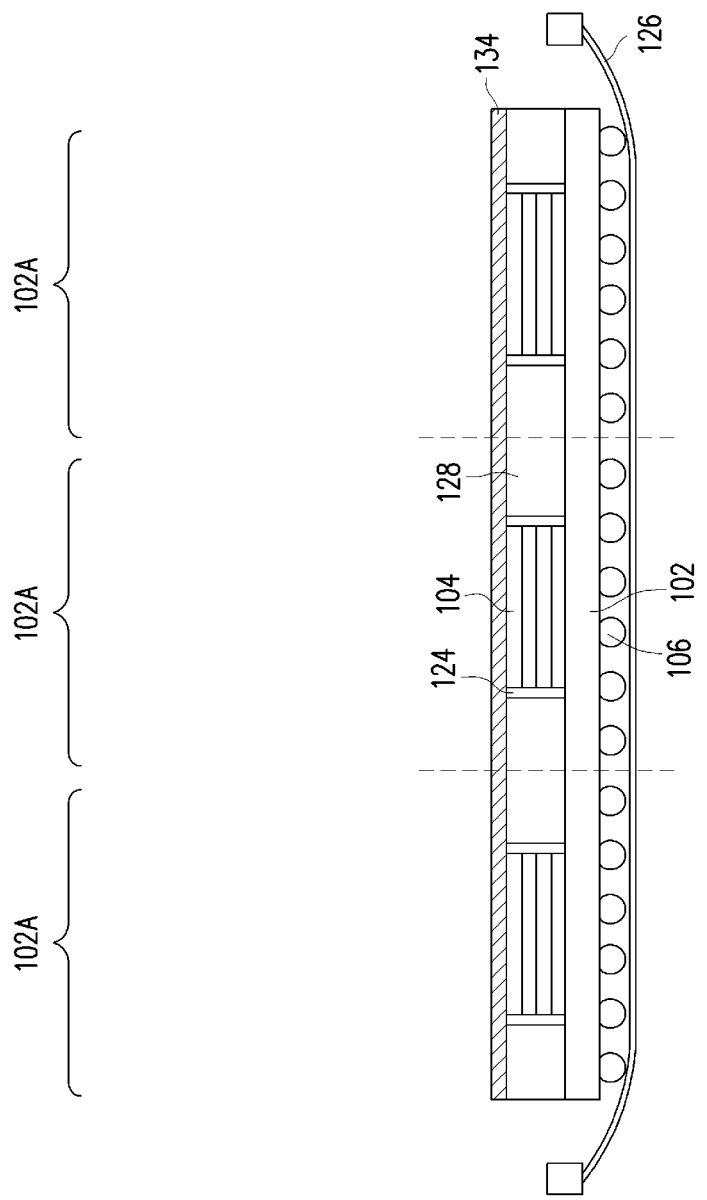

In FIG. 35, the device wafer 102, dummy wafer 112, and dummy metallization 134 are simultaneously singulated by a singulation process, thereby forming the integrated circuit dies 50 and dummy semiconductor features 128. The singulation may be accomplished by placing the device wafer 102 on tape 126, and sawing along scribe line regions e.g., between adjacent package regions of the device wafer 102.

Figure 36:
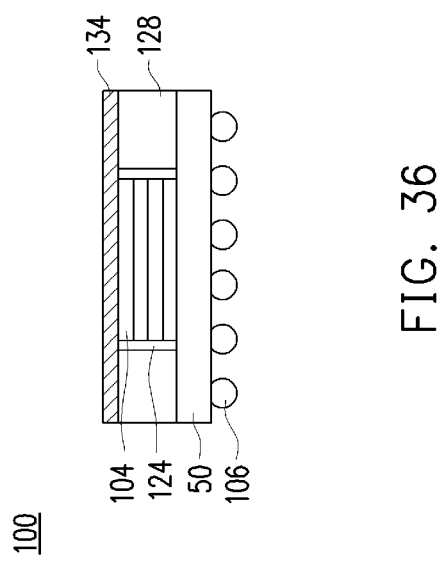

FIG. 36 shows the resulting singulated device package 100. Because the device wafer 102, dummy wafer 112, and dummy metallization 134 are simultaneously singulated, the edges of the dummy semiconductor features 128 are laterally coterminous with the edges of the integrated circuit die 50 and the edges of the dummy metallization 134. In other words, the outer sidewalls of the dummy semiconductor features 128 have the same width as the outer sidewalls of the integrated circuit die 50 and dummy metallization 134.

Figure 37:
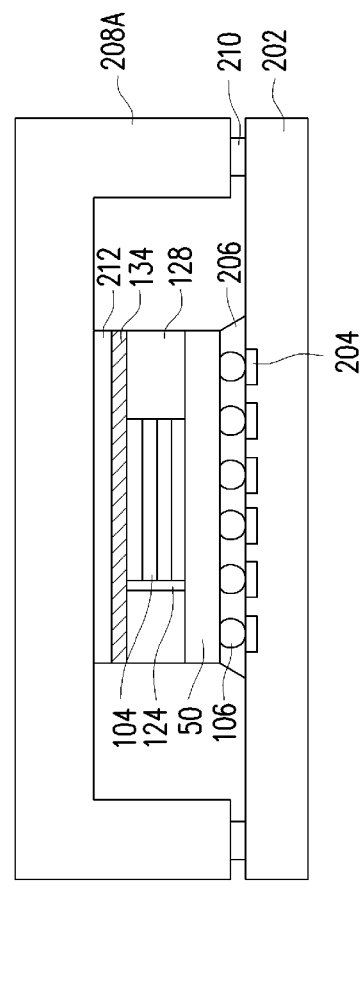

In FIG. 37, the device package 200 is formed by mounting the device package 100 to the package substrate 202. In some embodiments, the conductive connectors 106 are reflowed to attach the device package 200 to the bond pads 204 of the package substrate 202. The underfill 206 may be formed between the device package 200 and the package substrate 202, surrounding the conductive connectors 106. Because the integrated circuit die 50 is the same width as the dummy semiconductor features 128, the underfill 206 does not surround the integrated circuit die 50.

Further in FIG. 37, the heat spreader 208A is attached to the device package 200. The TIM 212 is dispensed on the dummy metallization 134. In the embodiment of FIGS. 34 through 37, the TIM 212 is a metallic TIM such as solder paste, indium solder paste, or the like. The adhesive 210 is used to adhere the heat spreader 208A to the package substrate 202. The TIM 212 may be dispensed on the dummy metallization 134, thermally coupling the device package 100 and heat spreader 208A. In the embodiment shown, the heat spreader 208A may have a gold coating, and the TIM 212 may be reflowed, forming a eutectic compound with the gold coating and the material of the dummy metallization 134.

Figure 38:
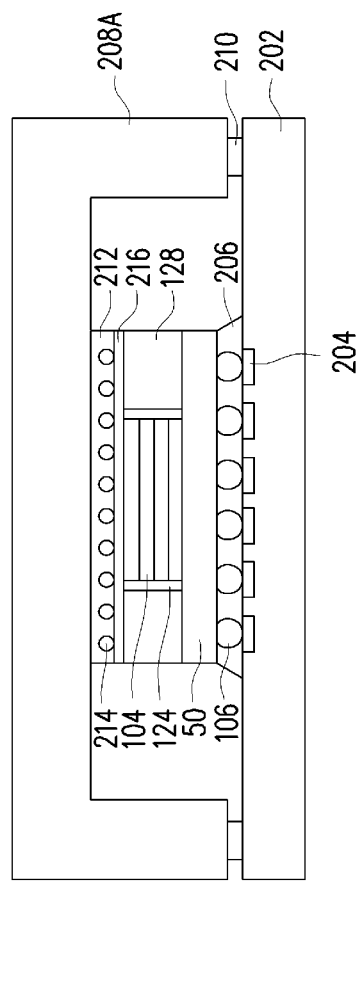
FIG. 38 shows an intermediate step during a process for forming device packages, in accordance with some other embodiments.

FIG. 38 shows an intermediate step during a process for forming device packages, in accordance with some other embodiments. FIG. 38 is a cross-sectional view. In the embodiment shown in FIG. 38, dummy conductive features 214 are formed at the interface the device package 100 and heat spreader 208A. The dummy conductive features 214 may further improve the thermal coupling between the device package 100 and heat spreader 208A. Although the dummy conductive features 214 is illustrated as being formed in the embodiment shown in FIGS. 18 through 24B, it should be appreciated that the dummy metallization 134 may be formed for any embodiments where the heat spreader 208A is attached to the device package 200.

In FIG. 38, an adhesive 216 is formed on the device package 100. The adhesive is on the die stacks 104, adhesive 124, and dummy semiconductor features 128. The adhesive 216 may be formed on the device package 100 before or after the device package 100 is singulated. The adhesive 216 may be similar to the adhesive 210, or may be different. The dummy conductive features 214 are formed on the adhesive 216, and are formed of a conductive material having a higher thermal conductivity than the material of the dummy semiconductor features 128. For example, the dummy conductive features 214 may be, e.g., solder balls, and may be formed by a pick and place method. The dummy conductive features 214 may be electrically isolated from the die stacks 104, integrated circuit die 50, and other surrounding devices. The TIM 212 is then dispensed on the adhesive 216 and around the dummy conductive features 214. The heat spreader 208A is attached to the device package 200 with the adhesive 210 and TIM 212.

Further in FIG. 38, the heat spreader 208A is attached to the device package 200. The TIM 212 is dispensed on the dummy metallization 134. In the embodiment of FIGS. 34 through 37, the TIM 212 is a metallic TIM such as solder paste, indium solder paste, or the like. The adhesive 210 is used to adhere the heat spreader 208A to the package substrate 202. The TIM 212 may be dispensed on the dummy metallization 134, thermally coupling the device package 100 and heat spreader 208A. In the embodiment shown, the heat spreader 208A may have a gold coating, and the TIM 212 may be reflowed, forming a eutectic compound with the gold coating and the material of the dummy metallization 134.

Embodiments may achieve advantages. The dummy semiconductor features 128 in the integrated circuit dies 50 may be sufficiently thermally conductive to help remove some of the heat produced by the integrated circuit die 50. The material of the dummy semiconductor features 128 (e.g., silicon) is abundant and may be less costly than other thermally conductive materials. Adding additional features, such as the vias 132 in the dummy semiconductor features 128, may further increase the thermal conductivity of the dummy semiconductor features 128, lowering the operating temperatures of the device packages 100. Further, features such as the dummy metallization 134 and/or dummy conductive features 214 may increase thermal conductivity to the heat spreader 208A. The dummy semiconductor features 128 may remove sufficient heat to help prevent heat from being trapped under the die stacks 104, thereby decreasing the operating temperature of the device packages 100 and improving the reliability and electrical performance of the device packages 100.

In an embodiment, a method includes: placing a die stack on a front side of a device wafer; forming conductive connectors on a back side of the device wafer; singulating the device wafer to form an integrated circuit die, the die stack disposed on the integrated circuit die; placing the integrated circuit die on a carrier substrate; bonding the front side of a dummy wafer to the integrated circuit die, the die stack disposed in a recess in the front side of the dummy wafer; debonding the integrated circuit die from the carrier substrate; and singulating the dummy wafer to form a dummy semiconductor feature, the dummy semiconductor feature laterally surrounding the die stack, the dummy semiconductor feature electrically isolated from the die stack and the integrated circuit die.

In some embodiments, the method further includes: before the singulating the dummy wafer, thinning a back side of the dummy wafer until the recess is exposed, thereby forming an opening extending through the dummy wafer; and forming an adhesive in the opening, top surfaces of the adhesive, the dummy wafer, and the die stack being level. In some embodiments, the method further includes: before the bonding the front side of the dummy wafer to the integrated circuit die, forming an adhesive on the die stack; and placing the front side of the dummy wafer on the integrated circuit die, the adhesive filling the recess. In some embodiments, the method further includes: bonding the integrated circuit die to a package substrate with the conductive connectors; forming an underfill between the package substrate and the integrated circuit die, the underfill surrounding the conductive connectors and the integrated circuit die; and attaching a heat spreader to the package substrate, the heat spreader adhered to the dummy semiconductor feature.

In an embodiment, a method includes: placing a die stack on a front side of a device wafer; bonding a front side of a dummy wafer to the front side of the device wafer, the die stack disposed in a recess in the front side of the dummy wafer; thinning a back side of the dummy wafer until the recess is exposed, thereby forming an opening extending through the dummy wafer; forming an adhesive in the opening, top surfaces of the adhesive, the dummy wafer, and the die stack being level; forming conductive connectors on a back side of the device wafer; and singulating the device wafer and the dummy wafer simultaneously, the device wafer singulated to form an integrated circuit die, the die stack disposed on the integrated circuit die, the dummy wafer singulated to form a dummy semiconductor feature, the dummy semiconductor feature laterally surrounding the die stack, the dummy semiconductor feature electrically isolated from the die stack and the integrated circuit die.

In some embodiments, the method further includes: forming vias extending from the front side of the dummy wafer into the dummy wafer. In some embodiments, the method further includes: before the singulating the device wafer and the dummy wafer, forming dummy metallization on the dummy wafer. In some embodiments, the method further includes: bonding the integrated circuit die to a package substrate with the conductive connectors; forming an underfill between the package substrate and the integrated circuit die, the underfill surrounding the conductive connectors and the integrated circuit die; and attaching a heat spreader to the package substrate, the heat spreader adhered to the dummy semiconductor feature.

In an embodiment, a device includes: an integrated circuit die having a first side and a second side opposite the first side; a die stack on the first side of the integrated circuit die; a dummy semiconductor feature on the first side of the integrated circuit die, the dummy semiconductor feature laterally surrounding the die stack, the dummy semiconductor feature electrically isolated from the die stack and the integrated circuit die; a first adhesive disposed between the die stack and the dummy semiconductor feature; and a plurality of conductive connectors on the second side of the integrated circuit die.

In some embodiments, top surfaces of the dummy semiconductor feature, the die stack, and the first adhesive are level. In some embodiments, the dummy semiconductor feature extends laterally past edges of the integrated circuit die. In some embodiments, edges of the dummy semiconductor feature and the integrated circuit die are coterminous. In some embodiments, the first adhesive is disposed on the die stack, and the dummy semiconductor feature is disposed on the first adhesive. In some embodiments, the device further includes: vias extending from the first side of the integrated circuit die into the dummy semiconductor feature. In some embodiments, the vias extend through the dummy semiconductor feature. In some embodiments, the vias extend partially into the dummy semiconductor feature. In some embodiments, the device further includes: a package substrate, the conductive connectors bonded to the package substrate; and a support ring adhered to the package substrate, the support ring surrounding the integrated circuit die. In some embodiments, the device further includes: a package substrate, the conductive connectors bonded to the package substrate; a heat spreader adhered to the package substrate; and a thermal interface material adhering the heat spreader to the dummy semiconductor feature. In some embodiments, the device further includes: dummy metallization on the dummy semiconductor feature, the thermal interface material disposed on the dummy metallization. In some embodiments, the device further includes: a second adhesive on the dummy semiconductor feature; and dummy conductive features disposed on the second adhesive, the thermal interface material disposed on the second adhesive and surrounding the dummy conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
an integrated circuit die having a first side and a second side opposite the first side;
a die stack on the first side of the integrated circuit die;
a dummy semiconductor feature on the first side of the integrated circuit die, the dummy semiconductor feature being bonded to the integrated circuit die by covalent bonds between a material of the dummy semiconductor feature and a material of the integrated circuit die, the dummy semiconductor feature laterally surrounding the die stack, the dummy semiconductor feature electrically isolated from the die stack and the integrated circuit die;
a first adhesive disposed between the die stack and the dummy semiconductor feature;
a plurality of conductive connectors on the second side of the integrated circuit die;
a package substrate, the conductive connectors bonded to the package substrate; and
a metal feature adhered to the package substrate, the metal feature at least laterally surrounding the integrated circuit die.

2. The device of claim 1, wherein top surfaces of the dummy semiconductor feature, the die stack, and the first adhesive are level.

3. The device of claim 2, wherein the dummy semiconductor feature extends laterally past edges of the integrated circuit die.

4. The device of claim 2, wherein edges of the dummy semiconductor feature and the integrated circuit die are coterminous.

5. The device of claim 1, wherein the first adhesive is disposed on the die stack, and the dummy semiconductor feature is disposed on the first adhesive.

6. The device of claim 1, further comprising:
vias extending from the first side of the integrated circuit die into the dummy semiconductor feature.

7. The device of claim 6, wherein the vias extend through the dummy semiconductor feature.

8. The device of claim 6, wherein the vias extend partially into the dummy semiconductor feature.

9. The device of claim 1, wherein the metal feature is a support ring surrounding the integrated circuit die.

10. The device of claim 1, wherein the metal feature is a heat spreader, the device further comprising:
a thermal interface material adhering the heat spreader to the dummy semiconductor feature.

11. The device of claim 10, further comprising:
dummy metallization on the dummy semiconductor feature, the thermal interface material disposed on the dummy metallization.

12. The device of claim 10, further comprising:
a second adhesive on the dummy semiconductor feature; and
dummy conductive features disposed on the second adhesive, the thermal interface material disposed on the second adhesive and surrounding the dummy conductive features.

13. A device comprising:
a logic die having a front side and a back side opposite the front side, the logic die comprising a semiconductor substrate and metallization patterns, the semiconductor substrate comprising active devices, the metallization patterns interconnecting the active devices of the semiconductor substrate;
a memory die stack bonded to the front side of the logic die;
a dummy semiconductor feature bonded to the front side of the logic die, the dummy semiconductor feature laterally surrounding the memory die stack, the dummy semiconductor feature extending laterally past edges of the semiconductor substrate of the logic die;
an adhesive disposed between the memory die stack and the dummy semiconductor feature; and
conductive connectors attached to the back side of the logic die.

14. The device of claim 13, wherein top surfaces of the adhesive, the dummy semiconductor feature, and the memory die stack are planar.

15. The device of claim 13, wherein the dummy semiconductor feature has a first portion and a second portion, the first portion laterally surrounding the memory die stack, the second portion being disposed over the memory die stack.

16. The device of claim 13 further comprising:
conductive vias extending away from the logic die and into the dummy semiconductor feature, the conductive vias physically contacting the logic die.

17. A device comprising:
an integrated circuit die having a front side and a back side opposite the front side;
a die stack bonded to the front side of the integrated circuit die;
a dummy semiconductor feature bonded to the front side of the integrated circuit die, the dummy semiconductor feature laterally surrounding the die stack, the dummy semiconductor feature bonded to the integrated circuit die by dielectric-to-dielectric bonds and by metal-to-metal bonds, the metal-to-metal bonds being bonds between conductive features of the integrated circuit die and conductive features of the dummy semiconductor feature, the conductive features of the dummy semiconductor feature being electrically isolated from active devices of the integrated circuit die and the die stack;
an adhesive disposed between the die stack and the dummy semiconductor feature, surfaces of the adhesive, the die stack, and the dummy semiconductor feature being planar; and
dummy metallization disposed on the planar surfaces of the adhesive, the die stack, and the dummy semiconductor feature, the dummy metallization being electrically isolated from the active devices of the integrated circuit die and the die stack.

18. The device of claim 17, wherein the dummy semiconductor feature comprises:
conductive vias extending through the dummy semiconductor feature, the conductive vias physically contacting the integrated circuit die and the dummy metallization.

19. The device of claim 18, wherein the metal-to-metal bonds are bonds between the conductive vias and the conductive features of the integrated circuit die.

20. The device of claim 17 further comprising:
a package substrate bonded to the back side of the integrated circuit die;
a heat spreader adhered to the package substrate; and
a thermal interface material thermally coupling the heat spreader to the dummy metallization.

* * * * *